United States Patent
Sato

(10) Patent No.: US 10,794,773 B2
(45) Date of Patent: Oct. 6, 2020

(54) SEMICONDUCTOR DEVICE, SEMICONDUCTOR PACKAGE, SEMICONDUCTOR MODULE, AND SEMICONDUCTOR CIRCUIT DEVICE

(71) Applicant: FUJI ELECTRIC CO., LTD., Kanagawa (JP)

(72) Inventor: Kenichiro Sato, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/257,068

(22) Filed: Jan. 24, 2019

(65) Prior Publication Data

US 2019/0301946 A1 Oct. 3, 2019

(30) Foreign Application Priority Data

Mar. 30, 2018 (JP) ................................. 2018-067425
Jul. 5, 2018 (JP) ................................. 2018-127942

(51) Int. Cl.
*H01L 23/49* (2006.01)
*H01L 23/495* (2006.01)
(Continued)

(52) U.S. Cl.
CPC ............ *G01K 7/015* (2013.01); *H01L 23/473* (2013.01); *H01L 23/495* (2013.01);
(Continued)

(58) Field of Classification Search
CPC ............... H01L 29/732; H01L 29/7325; H01L 29/7391; H01L 29/7393; H01L 29/7395;
(Continued)

(56) References Cited

U.S. PATENT DOCUMENTS

| 10,204,849 B2 * | 2/2019 | Nakamura ............ H02M 7/537 |
| 2009/0230500 A1 * | 9/2009 | Yoshikawa ......... H01L 27/0255 257/470 |
| 2010/0187567 A1 | 7/2010 | Tanabe |

FOREIGN PATENT DOCUMENTS

| JP | 2007329330 A | 12/2007 |
| JP | 2008235405 A * | 10/2008 ............. H01L 29/78 |

(Continued)

*Primary Examiner* — Natalia A Gondarenko

(57) ABSTRACT

A semiconductor device that can detect temperature appropriately is provided. A semiconductor device provided with a semiconductor substrate in which one or more transistor portions and one or more diode portions are provided is provided, including: a temperature detecting portion provided above the top surface of the semiconductor substrate and having a longitudinal side in a predetermined longitudinal direction; a top surface electrode provided above the top surface of the semiconductor substrate; and one or more external lines that have a connecting part connected with the top surface electrode and electrically connect the top surface electrode to a circuit outside the semiconductor device. The temperature detecting portion extends across the one or more transistor portions and the one or more diode portions in the longitudinal direction, and the connecting part of at least one of the external lines is arranged around the temperature detecting portion when seen from above.

13 Claims, 27 Drawing Sheets

(51) Int. Cl.
*H01L 29/08* (2006.01)
*H01L 29/739* (2006.01)
*H01L 29/861* (2006.01)
*G01K 7/01* (2006.01)
*H01L 23/473* (2006.01)

(52) U.S. Cl.
CPC ...... *H01L 29/0834* (2013.01); *H01L 29/0839* (2013.01); *H01L 29/7397* (2013.01); *H01L 29/861* (2013.01)

(58) Field of Classification Search
CPC ............ H01L 29/7396; H01L 29/7397; H01L 29/0839; H01L 29/861; H01L 29/0834; H01L 29/16; H01L 29/407; H01L 29/8613; H01L 29/8725; H01L 2924/13055; H01L 23/473; H01L 23/495; H01L 2224/49175; G01K 7/015; G01K 1/00
USPC .......... 257/470, 109, 678, E29.347, E29.166
See application file for complete search history.

(56) References Cited

FOREIGN PATENT DOCUMENTS

| | | | |
|---|---|---|---|
| JP | 2008235405 | A | 10/2008 |
| JP | 2010199559 | A | 9/2010 |
| JP | 2016012647 | A | 1/2016 |
| JP | 2017183530 | A | 10/2017 |

\* cited by examiner

SEMICONDUCTOR DEVICE, SEMICONDUCTOR PACKAGE, SEMICONDUCTOR MODULE, AND SEMICONDUCTOR CIRCUIT DEVICE

The contents of the following Japanese patent application(s) are incorporated herein by reference:
NO. 2018-067425 filed in JP on Mar. 30, 2018, and
NO. 2018-127942 filed in JP on Jul. 5, 2018.

TECHNICAL FIELD

The present invention relates to a semiconductor device, a semiconductor package, a semiconductor module and a semiconductor circuit device.

RELATED ART

Conventionally, a structure of a semiconductor chip in which transistors such as insulated gate bipolar transistors (IGBTs) and diodes such as free wheeling diodes FWD are provided in a single semiconductor substrate has been known, the structure including a temperature detecting element to detect chip temperature (please see Patent Document 1, for example). In addition, a water-cooled semiconductor module including transistors such as IGBTs has been known (for example, Patent Document 2).

Patent Document 1: Japanese Patent Application Publication No. 2008-235405
Patent Document 2: Japanese Patent Application Publication No. 2017-183530

SUMMARY

Improvement in product performance of semiconductor devices like the ones mentioned above has been demanded. For example, it is preferable if a temperature detecting element can detect chip temperature more appropriately.

In order to solve the above-mentioned drawbacks, one aspect of the present invention provides a semiconductor device provided with a semiconductor substrate. The semiconductor device may include one or more transistor portions provided in the semiconductor substrate. The semiconductor device may include one or more diode portions provided in the semiconductor substrate, and arranged to alternate with the transistor portion in an array direction parallel to a top surface of the semiconductor substrate. The semiconductor device may include a temperature detecting portion provided above the top surface of the semiconductor substrate and having a longitudinal side in a predetermined longitudinal direction. The semiconductor device may include a top surface electrode provided above the top surface of the semiconductor substrate. The semiconductor device may include one or more external lines that have a connecting part connected with the top surface electrode and electrically connect the top surface electrode to a circuit outside the semiconductor device. The temperature detecting portion may extend across the one or more transistor portions and the one or more diode portions in the longitudinal direction. The connecting part of at least one of the external lines may be arranged around the temperature detecting portion when seen from above.

The connecting part of the at least one of the external lines may be arranged above the one or more transistor portions and the one or more diode portions.

If a length of the temperature detecting portion in the longitudinal direction is referred to as a detecting-portion length, a distance between the connecting part of the at least one of the external lines and the temperature detecting portion when seen from above may be equal to or shorter than the detecting-portion length.

The diode portions may be arranged in a predetermined array pitch in the array direction. The connecting part of the at least one of the external lines may be spaced apart from the temperature detecting portion when seen from above by a distance which is equal to or shorter than 500% of the array pitch.

The one or more external lines may be wires. The one or more external lines may comprise a plurality of external lines connected to the top surface electrode. The connecting parts of at least two of the external lines may be spaced apart from the temperature detecting portion when seen from above by a distance which is equal to or shorter than 500% of the array pitch. The temperature detecting portion may be sandwiched, when seen from above, by any two connecting parts which are spaced apart from the temperature detecting portion by the distance which is equal to or shorter than 500% of the array pitch.

If a longitudinal length of the connecting parts of the external lines when seen from above is referred to as a connecting-portion length, a distance between the connecting part of the at least one of the external lines and the temperature detecting portion when seen from above may be equal to or shorter than the connecting-portion length.

The one or more external lines may comprise a plurality of external lines connected to the top surface electrode, and the connecting parts of the external lines may be provided at predetermined line intervals in a direction perpendicular to the longitudinal direction. A distance between the connecting part of the at least one of the external lines and the temperature detecting portion when seen from above may be equal to or shorter than the line interval.

When seen from above, the connecting part of at least one of the external lines may be provided to face the temperature detecting portion in a direction perpendicular to the longitudinal direction.

Two connecting parts may be arranged around the temperature detecting portion when seen from above and arranged along a direction parallel to the longitudinal direction of the temperature detecting portion. Each of the two connecting parts may be arranged to face a part, in the longitudinal direction, of the temperature detecting portion.

At least one additional connecting part may be arranged around the temperature detecting portion when seen from above. When seen from above, the temperature detecting portion may be arranged inside a rectangular region circumscribing the connecting parts.

The external lines may comprise a plurality of external lines, and the connecting parts of the plurality of external lines may be arranged around the temperature detecting portion more than in a region not around the temperature detecting portion when seen from above.

The external lines may be a lead frame.

The connecting parts of the external lines may include two first parts arranged to sandwich the temperature detecting portion in a direction perpendicular to the longitudinal direction of the temperature detecting portion. The connecting parts of the external lines may include a second part connecting the two first parts.

The semiconductor device may include a temperature detecting line provided above the top surface of the semiconductor substrate and connected with the temperature detecting portion. The second part of the connecting parts may be arranged opposite to the temperature detecting line when seen from above with respect to the temperature detecting portion.

The semiconductor device may include a gate pad provided above the top surface of the semiconductor substrate and connected with a gate metal layer of the transistor portions. The semiconductor device may include a temperature detecting line provided above the top surface of the semiconductor substrate and connected with the temperature detecting portion. The gate pad may be arranged opposite to the temperature detecting line when seen from above with respect to the temperature detecting portion.

The semiconductor device may include a cathode pad and an anode pad that are provided above the top surface of the semiconductor substrate and are connected with the temperature detecting line. The cathode pad and the anode pad may be arranged opposite to the gate pad with respect to the temperature detecting portion.

A second aspect of the present invention provides a semiconductor package including the semiconductor device according to the first aspect and the external circuit.

The semiconductor package may include two semiconductor devices. Each of the semiconductor devices may have a gate pad provided above the top surface of the semiconductor substrate and connected with a gate metal layer of the transistor portions. Each of the semiconductor devices may have a temperature detecting line provided above the top surface of the semiconductor substrate and connected with the temperature detecting portion. Each of the semiconductor devices may have a cathode pad and an anode pad that are provided above the top surface of the semiconductor substrate and are connected with the temperature detecting line. The gate pad may be arranged opposite to the temperature detecting line when seen from above with respect to the temperature detecting portion. The cathode pad and the anode pad may be arranged opposite to the gate pad with respect to the temperature detecting portion. If, in each of the semiconductor devices, an end side that is among individual end sides of the semiconductor substrate and is closest to the gate pad when seen from above is referred to as a gate pad end side, the two semiconductor devices may be arranged such that the gate pad end sides face each other.

A second aspect of the present invention provides a semiconductor module. The semiconductor module may include: a housing having a control terminal; and two semiconductor devices that are arranged inside the housing and are connected in parallel. The two semiconductor devices each have a detecting portion. The housing has a cooling portion through which a coolant flows in a predetermined flow path direction. The detecting portion of the semiconductor device arranged on one side in the flow path direction is connected to the control terminal, and the detecting portion of the semiconductor device arranged on the other side in the flow path direction is not connected to the control terminal.

The detecting portion may be a temperature detecting portion. The detecting portion may be a sense semiconductor element portion that detects current.

The housing may have a coolant inlet through which a coolant is let in and a coolant outlet through which a coolant is let out. A side closer to the coolant outlet may be the one side, and a side closer to the coolant inlet may be the other side.

The semiconductor device arranged on the one side in the flow path direction may have a detection pad connected to the detecting portion. The semiconductor device arranged on the other side in the flow path direction may not have a detection pad on a surface of the semiconductor device.

The two semiconductor devices may each have an emitter electrode. The detecting portion of the semiconductor device arranged on the other side in the flow path direction may be covered with the emitter electrode of the semiconductor device.

The semiconductor module may further include a plurality of line patterns in which the two semiconductor devices are arranged. The housing may have at least one additional control terminal, and the control terminals may be arranged in line on the one side.

The two semiconductor devices may each have: a transistor portion; and a gate pad connected with a gate metal layer of the transistor portions. The two semiconductor devices may be arranged in line in the flow path direction. A gate terminal may be provided between the two semiconductor devices in the flow path direction. Each of the gate pads of the two transistor portions may be connected to the gate terminal.

The gate pad of one of the semiconductor devices and the gate pad of the other of the semiconductor devices may be arranged to face each other in the flow path direction.

The areas of active portions of the two semiconductor devices may be the same.

A third aspect of the present invention provides a semiconductor module. The semiconductor modules includes a plurality of line patterns; a semiconductor device arranged on the line patterns and having a plated surface; and a lead frame having one end which is bonded to the surface of the semiconductor device and the other end which is bonded to the line patterns. The lead frame may have: a bridging portion protruding away from the surface of the semiconductor device; an opening provided in the bridging portion; and a molded portion arranged above and below the bridging portion.

The bridging portion may be provided between the one end and the other end. At least one additional opening may be provided.

The semiconductor device may have a temperature detecting portion above a top surface of a semiconductor substrate. The lead frame may be bonded to the surface of of the semiconductor device such that the lead frame sandwiches the temperature detecting portion.

A fourth aspect of the present invention provides a semiconductor device. The semiconductor device may include: a main semiconductor element portion provided in a semiconductor substrate, and including a transistor portion and a diode portion; a sense semiconductor element portion that is provided in the semiconductor substrate and includes: another transistor portion different from the transistor portion; and another diode portion arranged on an inner side relative to the other transistor portion and different from the diode portion; a current detecting circuit that detects a forward current and a reverse current of the sense semiconductor element portion; and a gate driving circuit that outputs a signal depending on a value of current of the reverse current.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in the direction parallel to the depth direction of a semiconductor substrate is referred to as the "upper" side, and the other side is referred to as the "lower" side. One of two principal surfaces of a substrate, a layer or another member is referred to as the top surface, and the other surface is referred to as the bottom surface. The "upward" and "downward" directions are not limited by the direction of gravity, or the direction of attachment to a substrate or the like at the time of mounting of a semiconductor device.

In the present specification, technical matters are explained using orthogonal coordinate axes which are an X-axis, a Y-axis and a Z-axis in some cases. In the present specification, an X-Y plane is a plane parallel to the top surface of a semiconductor substrate, and the Z-axis lies along the depth direction perpendicular to the top surface of the semiconductor substrate.

While in each example shown, a first conductivity type is N type and a second conductivity type is P type, the first conductivity type may also be P type and the second conductivity type may also be N type. In this case, the respective conductivity types of substrates, layers, regions and the like in each example will be of opposite polarities. In addition, in the present specification, "P+ type" (or "N+ type") means that the doping concentration is higher than "P type" (or "N type"), and "P− type" (or "N− type") means that the doping concentration is lower than P type (or N type).

In the present specification, doping concentration refers to the concentration of impurities acting as donors or acceptors. In the present specification, doping concentration refers to the difference between concentrations of donors and acceptors in some cases. In addition, if the doping concentration distribution of a doped region has a peak, the value of the peak may be used as the doping concentration of the doped region in some cases.

Figure 1:
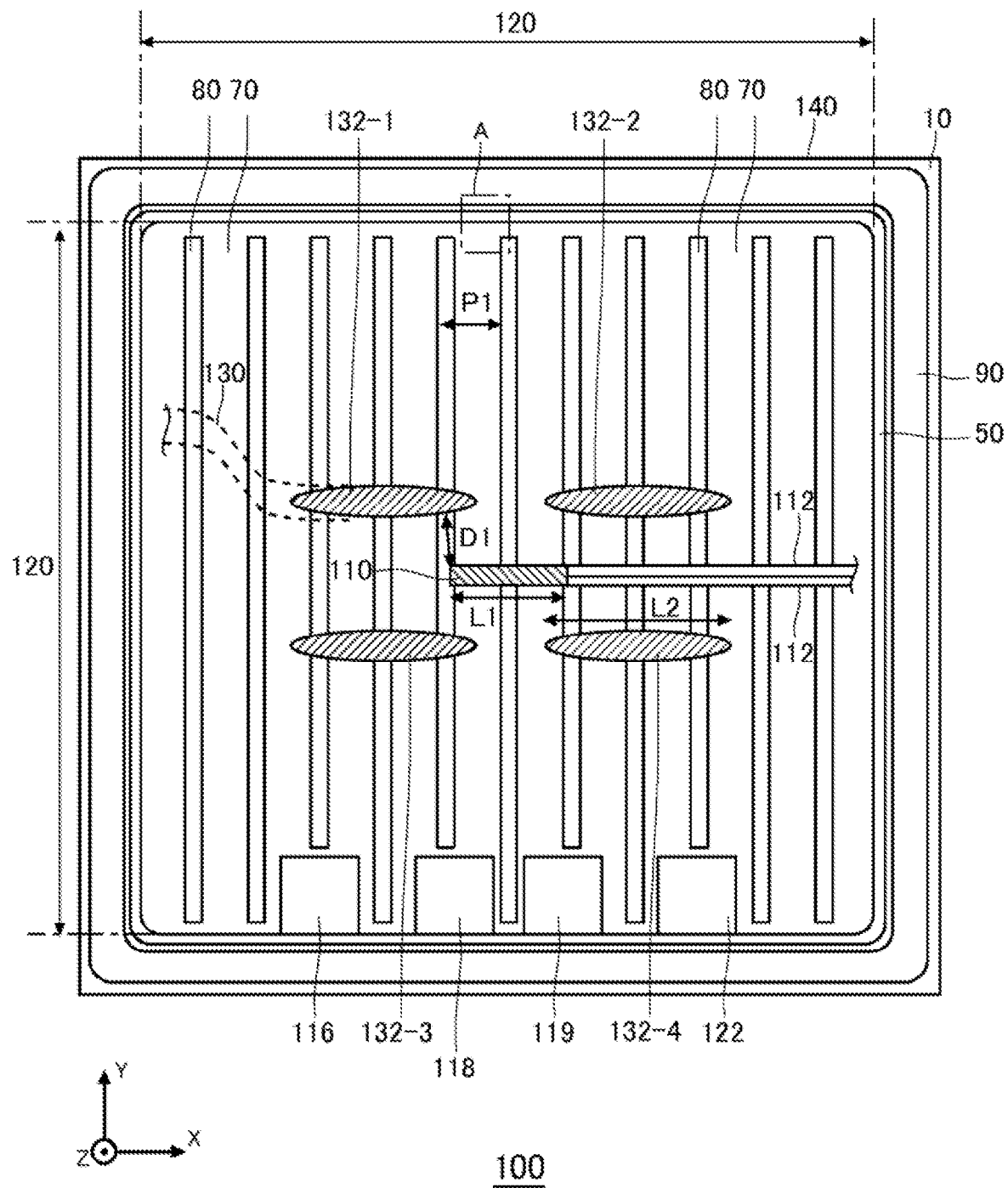
FIG. 1 is a schematic view showing the structure of the top surface of a semiconductor device 100 according to one embodiment of the present invention.

FIG. 1 is a schematic view showing the structure of the top surface of a semiconductor device 100 according to one embodiment of the present invention. The semiconductor device 100 includes a semiconductor substrate 10. The semiconductor substrate 10 may be a silicon substrate, a silicon carbide substrate, a nitride semiconductor substrate such as a gallium nitride substrate, or the like. The semiconductor substrate 10 in the present example is a silicon substrate.

In the present specification, an outer periphery portion of the semiconductor substrate 10 when seen from above is treated as an outer periphery 140. The phrase "when seen from above" means that an object is seen from the top surface side of the semiconductor substrate 10 in a direction parallel to the Z-axis. In addition, a direction parallel to any of end sides in the outer periphery 140 of the semiconductor substrate 10 when seen from above is treated as the X-axis direction, and a direction perpendicular to the end side is treated as the Y-axis direction.

The semiconductor device 100 includes an active portion 120 and an edge termination structure portion 90. The active portion 120 is a region where current flows inside the semiconductor substrate 10 in the depth direction from the top surface of the semiconductor substrate 10 to its bottom surface, or from the bottom surface to the top surface. For example, an active region is a region where main current flows between the top surface of the semiconductor substrate 10 to its bottom surface if a transistor element included in the semiconductor device 100 is being controlled to be in an ON state or if the transistor element is switched from an ON state to an OFF state. The active portion 120 may refer to a region surrounded by a gate runner 50 mentioned below.

The active portion 120 is provided with transistor portions 70 and diode portions 80. In the present specification, the transistor portions 70 and diode portions 80 are referred to as element portions or element regions, respectively, in some cases. In the present example, the transistor portions 70 and diode portions 80 are provided alternately in the X-axis direction in the active portion 120.

A plurality of pads (in the example of FIG. 1, a gate pad 116, a cathode pad 118, an anode pad 119 and a sense emitter pad 122) are provided above the top surface of the semiconductor substrate 10. The sense emitter pad 122 is connected with an emitter electrode arranged above the top surface of the semiconductor substrate 10. The gate pad 116 is connected with gate metal layers of the transistor portions 70. The cathode pad 118 and anode pad 119 are connected to a temperature detecting portion 110 mentioned below. Note that the number and types of pads provided in the semiconductor substrate 10 are not limited to those in the example shown in FIG. 1.

Each pad is formed of a metal material such as aluminum. The plurality of pads in the present example are array in a predetermined array direction (for example, the X-axis direction or Y-axis direction) along any of the end sides on the top surface of the semiconductor substrate 10.

The semiconductor device 100 includes the gate runner 50 that transmits gate voltage to the transistor portions 70. In one example, the gate runner 50 is provided above the top surface of the semiconductor substrate 10, and is insulated from the top surface of the semiconductor substrate 10 by an interlayer dielectric film.

The gate runner 50 is provided to pass through between an end side of the semiconductor substrate 10 and each pad when seen from above. The gate runner 50 in the present example is provided to pass through between each of the gate pad 116, cathode pad 118, anode pad 119 and sense emitter pad 122 and the end side closest to these pads and to be parallel to the end side. The gate runner 50 is connected with the gate pad 116. In addition, the gate runner 50 is provided to surround the active portion 120 between the other end sides of the semiconductor substrate 10 and the active portion 120. That is, the gate runner 50 in the present example is provided to form a ring along the individual end sides of the semiconductor substrate 10. The gate runner 50 may be a metal line formed of aluminum or the like, may be a semiconductor line formed of polysilicon doped with impurities or the like, or may be formed by overlaying a metal line and a semiconductor line with an insulating film interposed therebetween. The insulating film is provided with contact holes for connecting the metal line with the semiconductor line. The gate runner 50 in the present example is a metal line.

A transistor portion 70 includes a transistor such as an IGBT. A diode portion 80 includes a diode such as a FWD. In an array direction parallel to the top surface of the semiconductor substrate 10 (the X-axis direction in the present example), diode portions 80 are arranged with predetermined array pitches P1 therebetween and additionally are arranged alternately with transistor portions 70 in the X-axis direction.

Each diode portion 80 is provided with an N+ type cathode region in a region thereof contacting the bottom surface of the semiconductor substrate 10. Diode portions 80 indicated with solid lines in FIG. 1 are regions provided with cathode regions at the bottom surface of the semiconductor substrate 10. In the semiconductor device 100 in the present example, regions which are among regions contacting the bottom surface of the semiconductor substrate, but are not cathode regions are P+ type collector regions.

Diode portions 80 are regions which appear imaginarily when cathode regions are projected in the Z-axis direction. Transistor portions 70 are regions where collector regions are formed at the bottom surface of the semiconductor substrate 10 and additionally where unit structures including N+ type emitter regions are formed with pitches therebetween at the top surface of the semiconductor substrate 10. Regions extended in the Y-axis direction from regions which are in the active portion 120 and appear imaginarily when the cathode regions are projected in the Z-axis direction may also be treated as diode portions 80. Regions that are in the active portion 120, but are not diode portions 80 may be treated as transistor portions 70. Boundaries between the diode portions 80 and the transistor portions 70 in the X-axis direction are boundaries between cathode regions and collector regions.

The edge termination structure portion 90 is provided at the top surface of the semiconductor substrate 10 and between the gate runner 50 and the outer periphery 140 of the semiconductor substrate 10. The edge termination structure portion 90 may be arranged to form a ring so as to surround the gate runner 50 at the top surface of the semiconductor substrate 10. The edge termination structure portion 90 in the present example is arranged along the outer periphery 140 of the semiconductor substrate 10. The edge termination structure portion 90 relaxes electric field concentration on the top surface side of the semiconductor substrate 10. The edge termination structure portion 90 has a guard ring, a field plate, a RESURF or a structure obtained by combining them, for example.

The semiconductor device 100 includes the temperature detecting portion 110 and temperature detecting line 112. The temperature detecting portion 110 is provided above the active portion 120. The temperature detecting portion 110 may be provided at the middle of the active portion 120 when the semiconductor substrate 10 is seen from above. The temperature detecting portion 110 has a longitudinal side extending in a predetermined longitudinal direction. Although the longitudinal direction in the present example is the X-axis direction, the longitudinal direction may be different from the X-axis direction.

The temperature detecting portion 110 extends across one or more transistor portions 70 and one or more diode portions 80 in the longitudinal direction. In other words, a partial region of the temperature detecting portion 110 is arranged above the transistor portions 70, and another partial region of the temperature detecting portion 110 is arranged above the diode portions 80. The temperature detecting portion 110 may be a P-N temperature sense diode formed of monocrystal or polycrystal silicon.

The temperature detecting line 112 is provided above the active portion 120. The temperature detecting line 112 may be a semiconductor line formed of polysilicon doped with impurities or the like. The temperature detecting line 112 is connected with the temperature detecting portion 110. On the top surface of the semiconductor substrate 10, the temperature detecting line 112 extends to an end portion of the active portion 120 and is connected with the cathode pad 118 and anode pad 119. The temperature of the temperature detecting portion 110 can be detected by measuring electrical characteristics of the temperature detecting portion 110 via the cathode pad 118 and anode pad 119.

Since the temperature detecting portion 110 extends across one or more transistor portions 70 and one or more diode portions 80, the temperature reflecting heat-generation of both the transistor portions 70 and diode portions 80 can be detected. Because of this, the temperature can be detected precisely in both the state where the transistor portions 70 are in operation and the state where the diode portions 80 are in operation.

The detecting-portion length L1, which is the length in the longitudinal direction of the temperature detecting portion 110, is greater than the larger one of the width in the X-axis direction of diode portions 80 and the width in the X-axis direction of transistor portions 70. The detecting-portion length L1 of the temperature detecting portion 110 may be greater than the array pitch P1 of the diode portions 80 (that is, the sum of the width of a diode portion 80 and the width of a transistor portion 70). The detecting-portion length L1 of the temperature detecting portion 110 may be shorter than 300% of the array pitch P1 or may be shorter than 200% of the array pitch P1.

The semiconductor device 100 includes a top surface electrode provided above the top surface of the semiconductor substrate 10, but it is omitted in FIG. 1. The semiconductor device 100 includes one or more external lines 130 to electrically connect the top surface electrode to a circuit outside the semiconductor device 100. In one example, the external lines 130 is a wire formed of a conductive material such as a metal, but the external lines 130 may not be wires. The external lines 130 have connecting parts 132 connected with the top surface electrode. The connecting parts 132 refer to regions of the external lines 130 at which the external lines 130 contact the top surface electrode.

A connecting part 132 of at least one external line 130 is arranged around the temperature detecting portion 110 when seen from above. That a connecting part 132 is arranged around the temperature detecting portion 110 refers to a state where the connecting part 132 satisfies at least one of the following conditions when seen from above.

(1) The distance D1 between the connecting part 132 and the temperature detecting portion 110 is equal to or shorter than 500% of the array pitch P1.

(2) The distance D1 between the connecting part 132 and the temperature detecting portion 110 is equal to or shorter than the detecting-portion length L1.

(3) The distance D1 between the connecting part 132 and the temperature detecting portion 110 is equal to or shorter than the connecting-portion length L2, which is the length in the longitudinal direction of the connecting part 132.

Figure 4:
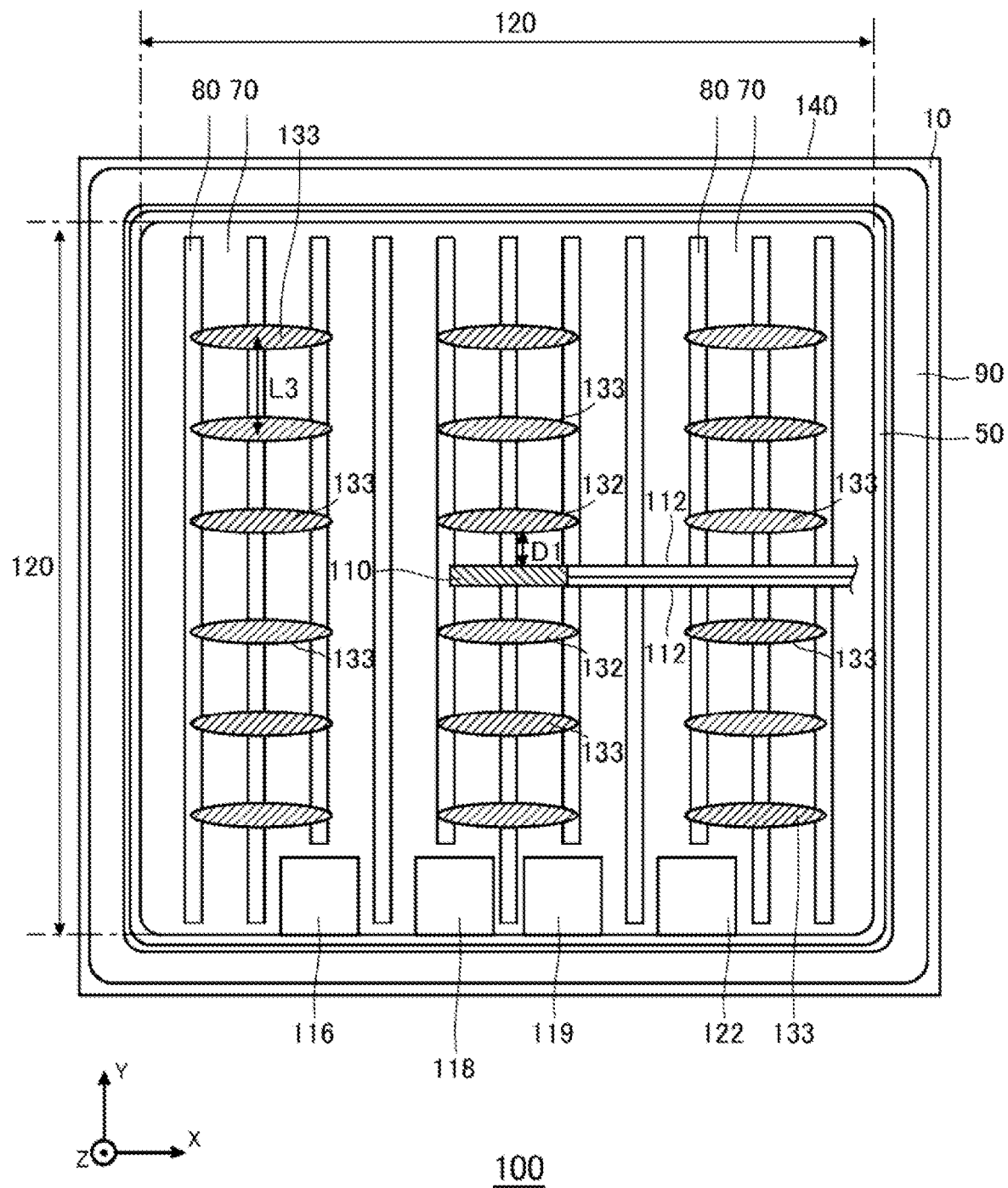
FIG. 4 is a figure showing another exemplary top surface structure of the semiconductor device 100.

(4) The distance D1 between the connecting part 132 and the temperature detecting portion 110 is equal to or shorter than the line interval L3 (please see FIG. 4).

Connecting parts 132 arranged around the temperature detecting portion 110 may satisfy two or more conditions, three or more conditions or all the conditions among the above-mentioned conditions (1) to (4). In addition, other numerical ranges described in the present specification may be used as numerical ranges of the individual conditions.

In the example of FIG. 1, the distance D1 between a connecting part 132 of at least one external line 130 and the temperature detecting portion 110 when seen from above is equal to or shorter than 500% of the array pitch P1. In the example of FIG. 1, only connecting parts 132 satisfying the condition are shown. In the present specification, connecting parts which are among connecting parts of external lines 130, but are not connecting parts 132 are treated as connecting parts 133 (please see FIG. 4, for example). In other words, connecting parts that are arranged around (that is, near) the temperature detecting portion 110 are treated as connecting parts 132, and connecting parts that are not arranged around (that is, near) the temperature detecting portion 110 are treated as connecting parts 133.

By arranging connecting parts 132 near the temperature detecting portion 110, the temperature detecting portion 110 can detect the temperature also reflecting heat-generation at the connecting parts 132. Because of this, the temperature of the semiconductor device 100 can be detected more precisely. The condition (1) may be modified to that the distance D1 between a connecting part 132 and the temperature detecting portion 110 is equal to or shorter than 300% of the array pitch P1 or may be is equal to or shorter than 200% of the array pitch P1. The distance D1 may be equal to or longer than the array pitch P1.

Note that the distance D1 between a connecting part 132 and the temperature detecting portion 110 may be the shortest distance between an end portion of the connecting part 132 and an end portion of the temperature detecting portion 110 when seen from above. In addition, connecting parts 132 are preferably arranged not to overlap the temperature detecting portion 110 and the temperature detecting line 112.

In addition, the top surface of the semiconductor substrate 10 may be provided with a plurality of connecting parts 132. In the example of FIG. 1, connecting parts 132-1, 132-2, 132-3, 132-4 are provided.

At least some of the plurality of connecting parts 132 may be arranged to face the temperature detecting portion 110 in the Y-axis direction. Thereby, heat from the connecting parts 132 can be easily received at longitudinal side parts of the temperature detecting portion 110, and the temperature reflecting heat-generation at the connecting parts 132 can be detected appropriately.

Note that being arranged to face in the Y-axis direction refers to that positions in at least partial regions on the X-axis overlap. Connecting parts 132 to face the temperature detecting portion 110 in the Y-axis direction may each be arranged on the Y-axis direction positive side and Y-axis direction negative side relative to the temperature detecting portion 110. In the example of FIG. 1, a connecting part 132-1 and a connecting part 132-3 (or a connecting part 132-2 and a connecting part 132-4) are arranged being separated to the Y-axis direction positive side and the Y-axis direction negative side relative to the temperature detecting portion 110. Thereby, temperature gradient of the temperature detecting portion 110 in the Y-axis direction can be reduced, and temperature can be detected precisely.

As shown in the condition (2), at least one connecting part 132 may have a distance D1 which is equal to or shorter than the detecting-portion length L1. As shown in the condition (3), at least one connecting part 132 may have a distance D1 which is equal to or shorter than the connecting-portion length L2 which is the length of connecting part 132 in the longitudinal direction. By arranging at least one connecting part 132 near the temperature detecting portion 110 so as to satisfy at least one of these conditions, the temperature detecting portion 110 can detect temperature more appropriately.

In addition, at least one connecting part 132 may be arranged above one or more transistor portions 70 and one or more diode portions 80. Thereby, nonuniformity in heat-generation at connecting parts 132 depending on operation states of the semiconductor device 100 can be suppressed.

In FIG. 4 mentioned below, a plurality of connecting parts 132, 133 are provided at predetermined line intervals L3 in the Y-axis direction perpendicular to the longitudinal direction of the connecting parts (the X-axis direction), but a large number of the plurality of connecting parts may be arranged around the temperature detecting portion 110 than in a region not around the temperature detecting portion 110 when seen from above. For example, when the numbers are compared in terms of the same area, a plurality of connecting parts may be arranged more densely in a range within the distance D1 from the temperature detecting portion 110 when seen from above which is equal to or shorter than 500% of the array pitch P1 (that is, in a range satisfying the condition (1)) than in other regions. The quantities of connecting parts arranged in individual regions may be measured in terms of the number of connecting parts or may measured in terms of the area occupied by them when seen from above. In addition, simply, the numbers of or the areas occupied by connecting parts arranged may be set to be greater in a range within the distance D1 from the temperature detecting portion 110 when seen from above which is equal to or shorter than 500% of the array pitch P1, when the range within the distance D1 which is equal to or shorter than 500% of the array pitch P1 and other ranges are compared. Other than them, in a configuration, a plurality of connecting parts may be more densely arranged as they become closer to the temperature detecting portion 110. As a range that is considered to be around the temperature detecting portion 110, a range satisfying any one or more of the above-mentioned conditions (1) to (4) can be used.

Figure 2:
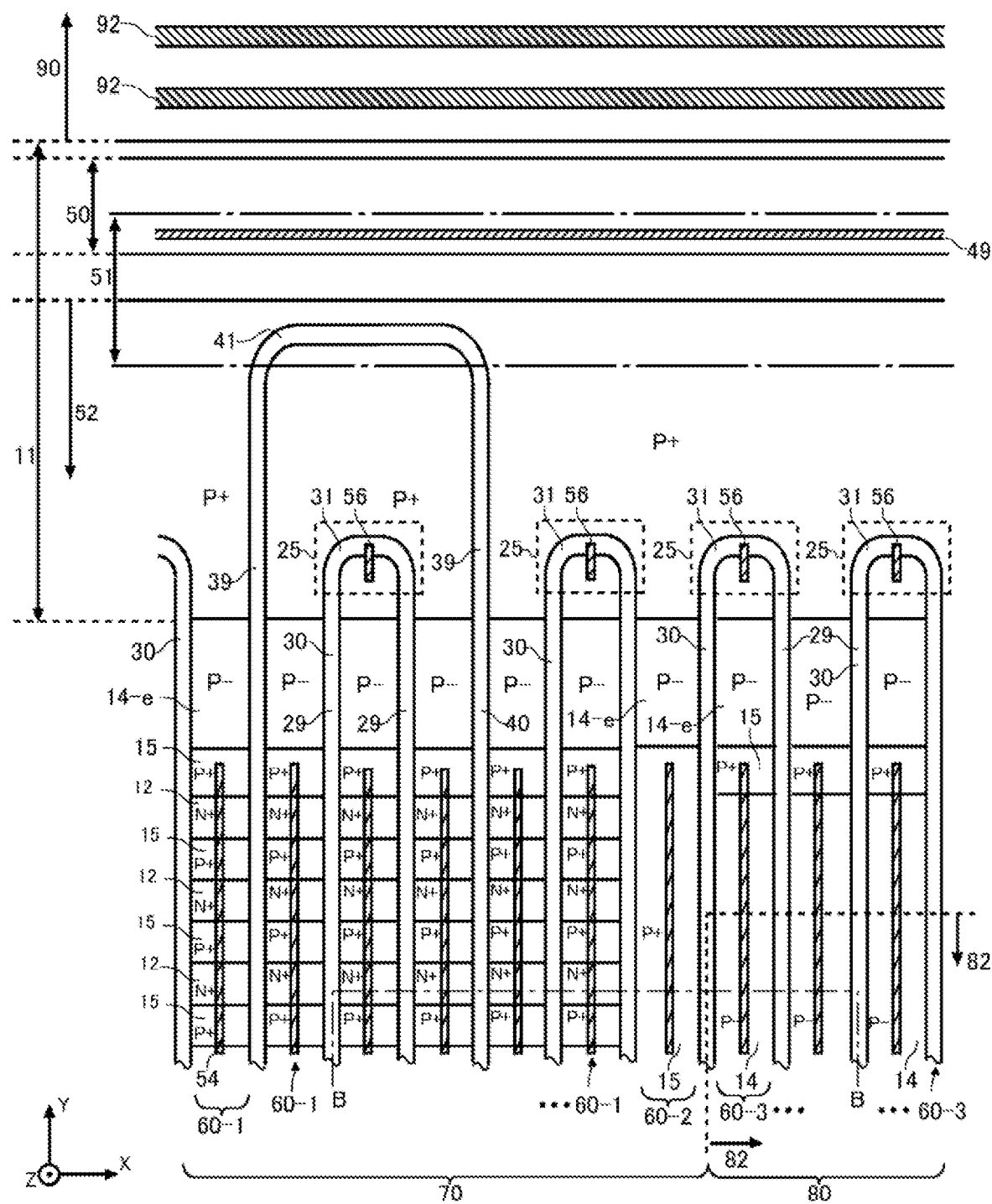
FIG. 2 is a figure showing an enlarged view of a section including and around a region A in FIG. 1.

FIG. 2 is a figure showing an enlarged view of a section including and around a region A in FIG. 1. The semiconductor device 100 in the present example is provided inside the semiconductor substrate 10, and includes guard rings 92, gate trench portion 40, dummy trench portions 30, a P+ type well region 11, N+ type emitter regions 12, P− type base regions 14 and P+ type contact regions 15 that are expose to the top surface of the semiconductor substrate 10. In the present specification, gate trench portions 40 or dummy trench portions 30 may be referred to simply as trench portions in some cases. In addition, the semiconductor device 100 in the present example includes an emitter electrode 52 and the gate runner 50 that are provided above the top surface of the semiconductor substrate 10. The emitter electrode 52 is an exemplary top surface electrode. The emitter electrode 52 and gate runner 50 are provided separately from each other.

The edge termination structure portion 90 is arranged outside the gate runner 50 (on the Y-axis direction positive side). The edge termination structure portion 90 may have one or more guard rings 92 as mentioned above. The guard rings 92 are P type region formed inside the semiconductor substrate 10. The guard rings 92 are provided to form a ring to surround the active portion 120 outside the gate runner 50.

An interlayer dielectric film is a formed between the emitter electrode 52 and gate runner 50, and the top surface of semiconductor substrate 10, it is omitted in FIG. 2. The interlayer dielectric film in the present example has contact holes 56, a contact hole 49 and contact holes 54 that are formed to penetrate the interlayer dielectric film.

The emitter electrode 52 passes the contact holes 54 to contact emitter regions 12, contact regions 15 and base regions 14 on the top surface of the semiconductor substrate 10. In addition, the emitter electrode 52 passes the contact holes 56, and is connected with dummy conductive portions in dummy trench portions 30. Connecting portions 25 formed of a conductive material such as polysilicon doped with impurities may be provided between the emitter electrode 52 and the dummy conductive portions. Insulating films such as oxide films are formed between the connecting portions 25 and the top surface of the semiconductor substrate 10.

The gate runner 50 passes the contact hole 49 and contacts a gate runner 51. Note that in FIG. 1, the gate runner 51 is omitted. The gate runner 51 is connected with gate trench portions 40. In another example, the gate runner 50 and gate trench portions 40 may be connected without the gate runner 51 therebetween.

The gate runner 51 is formed of polysilicon doped with impurities or the like. At the top surface of the semiconductor substrate 10, the gate runner 51 is connected with gate conductive portions in gate trench portions 40. The gate conductive portions are exemplary gate metal layers in transistor portions 70. The gate runner 51 is not connected with dummy conductive portions in dummy trench portions 30. The gate runner 51 in the present example is formed to lie from under the contact holes 49 to edge portions 41 of gate trench portions 40.

An insulating film such as an oxide film is formed between the gate runner 51 and the top surface of the semiconductor substrate 10. At edge portions 41 of gate trench portions 40, the gate conductive portions are exposed to the top surface of the semiconductor substrate 10. Contact holes connecting the gate conductive portions and the gate runner 51 are provided in the insulating film above the gate conductive portions. Note that although, in FIG. 2, there are locations where the emitter electrode 52 and the gate runner 51 overlap in a planar view, the emitter electrode 52 and the gate runner 51 are electrically insulated from each other with an unillustrated insulating film being sandwiched therebetween.

The emitter electrode 52 and gate runner 50 are formed of a metal-containing material. For example, at least a partial region of each electrode is formed of aluminum or an aluminum-silicon alloy. Each electrode may have a barrier metal formed of titanium, a titanium compound or the like at a layer underlying the region formed of aluminum or the like, and may have plugs formed of tungsten or the like in contact holes.

One or more gate trench portions 40 and one or more dummy trench portions 30 are arrayed on the top surface of the semiconductor substrate 10 at predetermined intervals along a predetermined array direction (the X-axis direction in the present example). In transistor portions 70 in the present example, one or more gate trench portion 40 and one or more dummy trench portion 30 are formed alternately along the array direction.

A gate trench portion 40 in the present example may have two straight line portions 39 extending in straight line forms along the longitudinal direction (the Y-axis direction in the present example) perpendicular to the array direction, and an edge portion 41 connecting the two straight line portions 39. At least a portion of the edge portion 41 is preferably formed to have a curvilinear form on the top surface of the semiconductor substrate 10. By the edge portion 41 connecting end portions which are the ends of the straight line shapes of the two straight line portions 39 of the gate trench portion 40 along the longitudinal direction, electric field concentration at the end portions of the straight line portions 39 can be relaxed.

At least one dummy trench portion 30 is provided between individual straight line portions 39 of a gate trench portion(s) 40. These dummy trench portions 30 may each have straight line portions 29 and an edge portion 31 similar to gate trench portions 40. In another example, a dummy trench portion 30 may have a straight line portion 29, but not have an edge portion 31. In the example shown in FIG. 2, two straight line portions 29 of a dummy trench portion 30 are arranged between two straight line portions 39 of a gate trench portion 40 in the transistor portion 70.

In the diode portion 80, a plurality of dummy trench portions 30 are arranged along the X-axis direction on the top surface of the semiconductor substrate 10. The shapes of the dummy trench portions 30 in the diode portion 80 when seen on an X-Y plane may be similar to dummy trench portions 30 provided in the transistor portion 70.

An edge portion 31 and straight line portions 29 of a dummy trench portion 30 have shapes similar to those of an edge portion 41 and straight line portions 39 of a gate trench portion 40. Dummy trench portions 30 provided in the diode portion 80 and dummy trench portion 30 with straight line shapes provided in the transistor portion 70 may have the same length in the Y-axis direction.

The emitter electrode 52 is formed above gate trench portions 40, dummy trench portions 30, the well region 11, emitter regions 12, base regions 14 and contact regions 15. The well region 11 and an end which is among ends in the longitudinal direction of the contact holes 54 and is on the side where the gate runner 50 is provided are provided separately from each other on an X-Y plane. The diffusion depth of the well region 11 may be deeper than the depth of the gate trench portions 40 and dummy trench portions 30. Partial regions of the gate trench portions 40 and dummy trench portions 30 which are closer to the gate runner 50 are formed in the well region 11. Bottom portions of edge portions 41 of gate trench portions 40 in the Z-axis direction and bottom portions of edge portions 31 of dummy trench portions 30 in the Z-axis direction may be covered with the well region 11.

Each of the transistor portion 70 and the diode portion 80 is provided with one or more mesa portion 60 sandwiched by individual trench portions. The mesa portions 60 are regions that: are in regions of the semiconductor substrate 10 that are sandwiched by trench portions; and are on the top surface side relative to the deepest bottom portions of the trench portions.

In a mesa portion 60 sandwiched by individual trench portions, a base region 14 is formed. The base region 14 is of a second conductivity type (P− type) with a doping concentration lower than that of the well region 11.

At the top surface of a base region 14 of the mesa portion 60, a second-conductivity-type contact region 15 with a doping concentration higher than that of the base region 14 is formed. The contact region 15 in the present example is of P+ type. At the top surface of the semiconductor substrate 10, the well region 11 may be formed separately from the last contact regions 15 in the Y-axis direction among contact regions 15, the well region 11 being separated in the direction toward the gate runner 50. At the top surface of the semiconductor substrate 10, base regions 14 are exposed between the well region 11 and contact regions 15.

In the transistor portion 70, first-conductivity-type emitter regions 12 with a doping concentration higher than that of drift regions formed inside the semiconductor substrate 10 are selectively formed at the top surfaces of mesa portions 60-1. The emitter regions 12 in the present example are of N+ type. Parts that constitute base regions 14 adjacent to emitter regions 12 in the depth direction (−Z-axis direction) of the semiconductor substrate 10 and are in contact with gate trench portions 40 function as channel portions. If an ON voltage is applied to a gate trench portion 40, a channel which is an electron inversion layer is formed at a part that is in a base region 14 provided between an emitter region 12 and a drift region in the Z-axis direction and is adjacent to the gate trench portion 40. By the channel being formed in the base region 14, carriers flow through between the emitter region 12 and the drift region.

In the present example, base regions 14-e are arranged at both end portions of each mesa portion 60 in the Y-axis direction. In the present example, at the top surface of each mesa portion 60, a region which is adjacent to a base region 14-e on the side closer to the middle of the mesa portion 60 is a contact region 15. In addition, a region that is in contact with the base region 14-e on the opposite side to the contact region 15 is the well region 11.

In a region sandwiched by base regions 14-e at both ends in the Y-axis direction in a mesa portion 60-1 of the transistor portion 70 in the present example, contact regions 15 and emitter regions 12 are arranged alternately along the Y-axis direction. Each of the contact regions 15 and emitter regions 12 is formed to lie from one of adjacent trench portions to the other trench portion.

One or more mesa portions 60-2 that are among mesa portions 60 in the transistor portion 70 and are provided at the boundary with the diode portion 80 are provided with a contact region 15 having an area larger than those of contact regions 15 in mesa portions 60-1. A mesa portion 60-2 needs not be provided with emitter regions 12. In the mesa portion 60-2 in the present example, the entire region sandwiched by base regions 14-e is provided with a contact region 15.

In each mesa portion 60-1 of the transistor portion 70 in the present example, a contact hole 54 is formed above individual regions of contact regions 15 and emitter regions 12. A contact hole 54 in the mesa portion 60-2 is formed above the contact region 15. In each mesa portion 60, a contact hole 54 is not formed in regions corresponding to base regions 14-e and the well region 11. Contact holes 54 in individual mesa portions 60 in the transistor portion 70 may have the same length in the Y-axis direction.

In the diode portion 80, an N+ type cathode region 82 is formed in a region contacting the bottom surface of the semiconductor substrate 10. In FIG. 2, the region in which the cathode region 82 is formed is indicated by broken lines. A P+ type collector region may be formed in a region which is in a region contacting the bottom surface of the semiconductor substrate 10 and in which the cathode region 82 is not formed.

The transistor portion 70 may be a region which is in a region overlapping collector regions in the Z-axis direction and in which mesa portions 60 where contact regions 15 and emitter regions 12 are formed and trench portions adjacent to the mesa portions 60 are provided. However, a contact region 15 may be provided instead of an emitter region 12 in the mesa portion 60-2 at the boundary with the diode portion 80.

At the top surface of a mesa portion 60-3 in the diode portion 80, a base region 14 is arranged. However, in a region adjacent to the base region 14-e, a contact region 15 may be provided. Contact holes 54 terminate above the contact regions 15.

Figure 3:
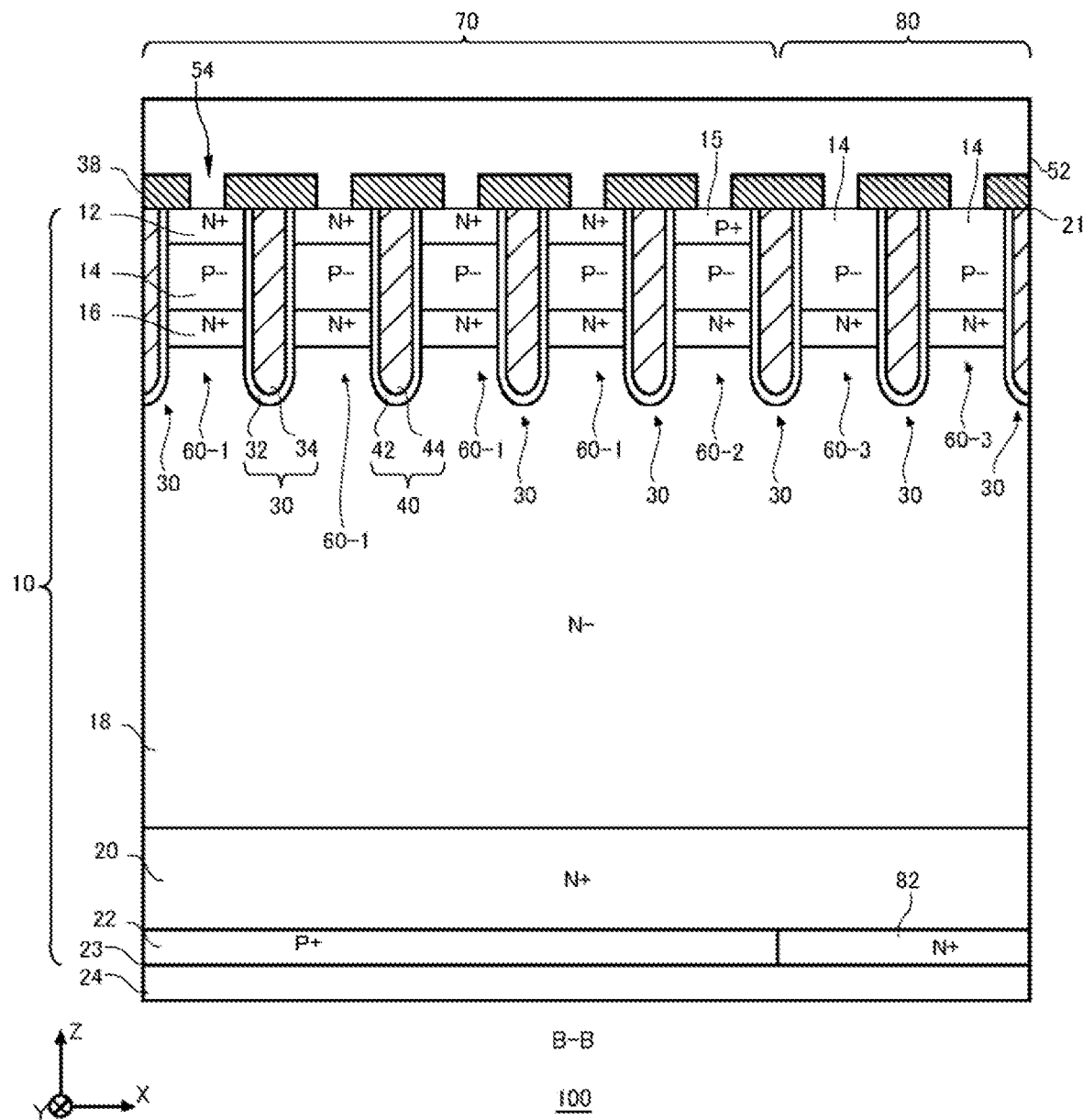
FIG. 3 is a figure showing an exemplary cross-section taken along B-B in FIG. 2.

FIG. 3 is a figure showing an exemplary cross-section taken along B-B in FIG. 2. The B-B cross-section is an X-Z plane including the diode portion 80 and transistor portion 70 and passing through emitter regions 12.

In the cross-section, the semiconductor device 100 in the present example has the semiconductor substrate 10, the interlayer dielectric film 38, the emitter electrode 52 and a collector electrode 24. The interlayer dielectric film 38 is formed to cover at least a portion of the top surface of the semiconductor substrate 10. Through-holes such as contact holes 54 are formed in the interlayer dielectric film 38. The contact holes 54 make the top surface of the semiconductor substrate 10 exposed. The interlayer dielectric film 38 may be a silicate glass such as a PSG or a BPSG, or may be an oxide film, a nitride film or the like.

The emitter electrode 52 is formed at the top surfaces of the semiconductor substrate 10 and interlayer dielectric film 38 in the transistor portion 70 and diode portion 80. The emitter electrode 52 is also formed inside the contact holes 54, and contact the top surface 21 of the semiconductor substrate 10 exposed through the contact holes 54.

As mentioned above, connecting parts 132 are connected with the top surface of the emitter electrode 52. In addition to a metal layer containing aluminum, the emitter electrode 52 may include a plated layer or solder layer provided onto the metal layer. Connecting parts 132 may be in contact with the metal layer, may be in contact with the plated layer or may be in contact with the solder layer.

The collector electrode 24 is formed at a bottom surface 23 of the semiconductor substrate 10. The collector electrode 24 may be in contact with the entire bottom surface 23 of the semiconductor substrate 10. The emitter electrode 52 and collector electrode 24 are formed of a conductive material such as metal. In the present specification, the direction linking the emitter electrode 52 and the collector electrode 24 is referred to as the depth direction (the Z-axis direction). The direction from the collector electrode 24 to the emitter electrode 52 is referred to as the positive direction of the Z-axis direction.

On the top surface side of the semiconductor substrate 10 in the diode portion 80 and transistor portion 70, P− type base regions 14 are formed. Inside the semiconductor substrate 10 and below the base regions 14, an N− type drift region 18 is arranged. Each trench portion is provided to penetrate base regions 14 from the top surface of the semiconductor substrate 10 and to reach the drift region 18.

In the cross-section, in each mesa portion 60-1 in the transistor portion 70, an N+ type emitter region 12, a P− type base region 14 and an N+ type accumulation region 16 are arranged in order from the top surface side of the semiconductor substrate 10. The accumulation regions 16 include donors that are accumulated at a higher concentration than that in the drift region 18. The drift region 18 is provided below the accumulation regions 16. An accumulation region 16 may be provided to cover the entire bottom surface of a base region 14 in each mesa portion 60. In other words, the accumulation region 16 may be sandwiched by trench portions in the X-axis direction. By providing the accumulation regions 16 with a concentration higher than that in the drift region 18 between the drift region 18 and the base regions 14, the career injection enhancement effect (IE effect) can be enhanced to lower ON voltage in the transistor portion 70.

Note that in an X-Z cross-section passing through contact regions 15 in the transistor portion 70, each mesa portion 60-1 in the transistor portion 70 is provided with a contact region 15 instead of an emitter region 12. In addition, the mesa portion 60-2 is provided with a contact region 15 instead of an emitter region 12. The contact region 15 may function as a latch-up suppression layer to suppress latch-ups.

In the cross-section, in each mesa portion 60-3 in the diode portion 80, a P− type base region 14 and an N+ type accumulation region 16 are arranged in order from the top surface side of the semiconductor substrate 10. The drift region 18 is provided below accumulation regions 16. The diode portion 80 may not be provided with accumulation regions 16.

In the transistor portion 70, in a region adjacent to the bottom surface 23 of the semiconductor substrate 10, a P+ type collector region 22 is provided. In the diode portion 80, in a region adjacent to the bottom surface 23 of the semiconductor substrate 10, the N+ type cathode region 82 is provided.

In the semiconductor substrate 10 in the present example, an N+ type buffer region 20 is provided between the drift region 18 and the collector region 22, and between the drift region 18 and the cathode region 82. The doping concentration of the buffer region 20 is higher than the doping concentration of the drift region 18. The buffer region 20 may function as a field-stop layer to prevent a depletion layer spreading from the bottom surface side of the base region 14 from reaching the P+ type collector region 22 and N+ type cathode region 82.

On the top surface 21 side of the semiconductor substrate 10, one or more gate trench portions 40 and one or more dummy trench portions 30 are formed. Each trench portion penetrates base regions 14 from the top surface 21 of the semiconductor substrate 10 and reaches the drift region 18. In a region in which at least any of emitter regions 12, contact regions 15 and accumulation regions 16 is provided, each trench portion penetrates those regions and reaches the drift region 18. That "trench portions penetrate doped regions" is not limited to one manufactured in the order of: forming the doped regions; and then forming the trench portions. One in which trench portions are formed, and then doped regions are formed between the trench portions is seen as one in which trench portions penetrate doped regions.

A gate trench portion 40 has a gate trench, a gate insulating film 42 and a gate conductive portion 44 that are formed on the top surface side of the semiconductor substrate 10. The gate insulating film 42 is formed to cover the inner wall of the gate trench. The gate insulating film 42 may be formed by oxidizing or nitriding a semiconductor on the inner wall of the gate trench. The gate conductive portion 44 is an exemplary gate metal layer. The gate conductive portion 44 is formed inside the gate trench and on the inner side relative to the gate insulating film 42. That is, the gate insulating film 42 insulates the gate conductive portion 44 from the semiconductor substrate 10. The gate conductive portion 44 is formed of a conductive material such as polysilicon.

The gate conductive portion 44 includes, in the depth direction, a region where it faces at least an adjacent base region 14 with the gate insulating film 42 being sandwiched therebetween. The gate trench portion 40 in the cross-section is covered with the interlayer dielectric film 38 at the top surface of the semiconductor substrate 10. If a predetermined voltage is applied to the gate conductive portion 44, a channel is formed by an electron inversion layer at a surface layer of an interface of the base region 14 contacting the gate trench.

A dummy trench portion 30 may have the same structure as that of gate trench portions 40 in the cross-section. The dummy trench portion 30 has a dummy trench, a dummy insulating film 32 and a dummy conductive portion 34 formed on the top surface 21 side of the semiconductor substrate 10. The dummy insulating film 32 is formed to cover the inner wall of the dummy trench. The dummy conductive portion 34 is formed inside the dummy trench and is formed on the inner side relative to the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have the same length as that of the gate conductive portion 44 in the depth direction. The dummy trench portion 30 in the cross-section is covered with the interlayer dielectric film 38 at the top surface 21 of the semiconductor substrate 10. Note that bottom portions of dummy trench portions 30 and gate trench portions 40 may have a surface form that protrudes downward (a curvilinear form in the cross-section).

FIG. 4 is a figure showing another exemplary top surface structure of the semiconductor device 100. In the semiconductor device 100 in the present example, a plurality of connecting parts 132, 133 are provided above the top surface of the semiconductor substrate 10. External lines in the present example are wires. Individual connecting parts are provided at predetermined line intervals L3 in the Y-axis direction perpendicular to the longitudinal direction of the connecting parts. The line intervals L3 refer to distances, in the Y-axis direction, between the middles of the connecting parts on an X-Y plane. The line intervals L3 are constant over the entire top surface of the semiconductor substrate 10.

In the present example, the distance D1 between at least one connecting part 132 and the temperature detecting portion 110 when seen from above is equal to or shorter than the line interval L3 (condition (4)). The distance D1 may be half the line interval L3 or shorter. In addition, the temperature detecting portion 110 may be arranged at the middle, in the Y-axis direction, of a region sandwiched by two connecting parts 132 in the Y-axis direction. With such arrangement, the temperature detecting portion 110 can detect temperature more appropriately.

Note that connecting parts may be arrayed predetermined intervals also in the X-axis direction. A plurality of connecting parts arrayed in the X-axis direction may be connecting parts of a single external line 130. In other words, one external line 130 may be connected with a top surface electrode at a plurality of positions in the X-axis direction.

Figure 5:
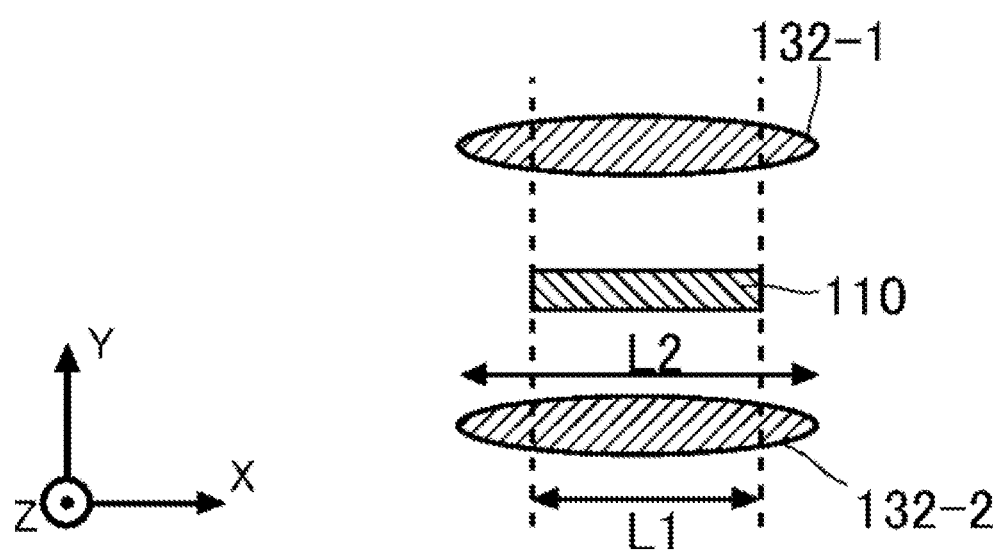
FIG. 5 is a figure showing an exemplary relationship between a temperature detecting portion 110 and connecting parts 132.

FIG. 5 is a figure showing an exemplary relationship between the temperature detecting portion 110 and connecting parts 132. As mentioned above, the temperature detecting portion 110 and the connecting parts 132 may be arranged to face each other in the Y-axis direction. In other words, as indicated by broken lines in FIG. 5, at least one connecting part 132 may be at least partially arranged in an imaginary region extending from the temperature detecting portion 110 in the Y-axis direction. As shown in FIG. 5, the connecting parts 132 may be arranged to face the entire temperature detecting portion 110 in the X-axis direction.

As shown in FIG. 5, the connecting-portion length L2 of the connecting parts 132 may be greater than the detecting-portion length L1. Thereby, even if relative positions between the connecting parts 132 and temperature detecting portions 110 in the X-axis direction are not constant among them, heat-generation at the connecting parts 132 can be detected precisely. Note that the connecting-portion length L2 may be equal to or shorter than the detecting-portion length L1. In addition, the temperature detecting portion 110 is preferably sandwiched by two connecting parts 132 in the Y-axis direction. Thereby, even if relative positions between the temperature detecting portions 110 and connecting parts 132 in the Y-axis direction are not constant among them, heat-generation at the connecting parts 132 can be detected precisely.

Figure 6:
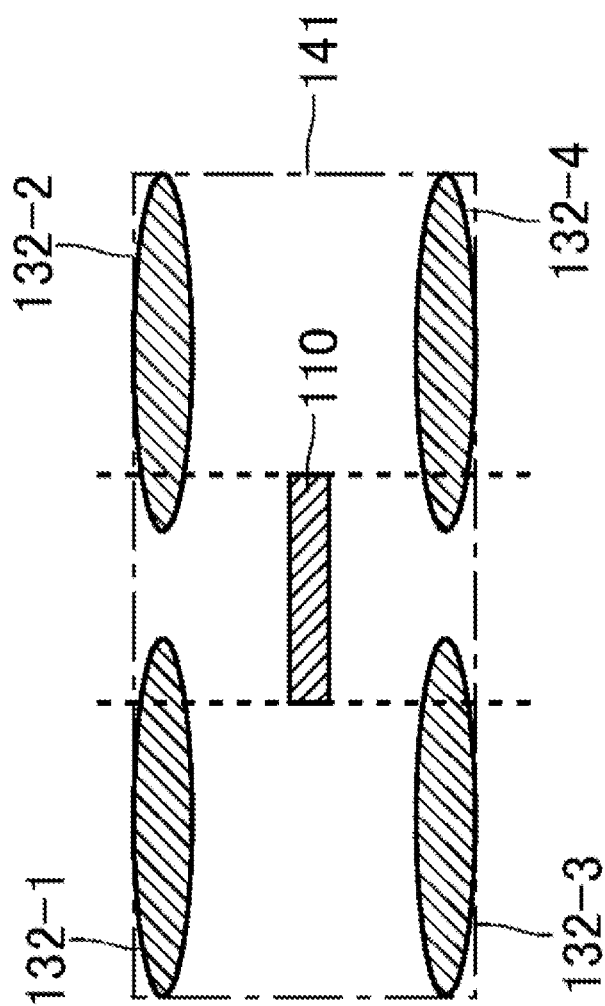
FIG. 6 is a figure showing another exemplary relationship between the temperature detecting portion 110 and connecting parts 132.

FIG. 6 is a figure showing another exemplary relationship between the temperature detecting portion 110 and connecting parts 132. The connecting parts 132 in the present example are arranged to face parts, in the X-axis direction, of the temperature detecting portion 110. Note that the number of connecting parts 132 partially facing the temperature detecting portion 110 may be greater than one in the X-axis direction. In the example of FIG. 6, two connecting parts 132 partially facing the temperature detecting portion 110 are arranged in line in the X-axis direction. In addition, one or more connecting parts 132 partially facing the temperature detecting portion 110 may be arranged on both the Y-axis direction positive side and the Y-axis direction negative side with respect to the temperature detecting portion 110. In the example of FIG. 6, two connecting parts 132 are arranged on both the Y-axis direction positive side and the Y-axis direction negative side of the temperature detecting portion 110. With such arrangement, even if nonuniformity occurs to heat-generation at the connecting parts 132, heat-generation from a plurality of connecting parts 132 reaches the temperature detecting portion 110 so that influence of such nonuniformity can be reduced.

In addition, a rectangular region circumscribing a plurality of connecting parts 132 on an X-Y plane is referred to as a region 141. The region 141 has sides extending in the X-axis direction and Y-axis direction. The temperature detecting portion 110 may be provided inside the region 141. The temperature detecting portion 110 may be arranged at the middle of the region 141. With such arrangement, heat-generation at the connecting parts 132 can be detected more appropriately.

Figure 7:
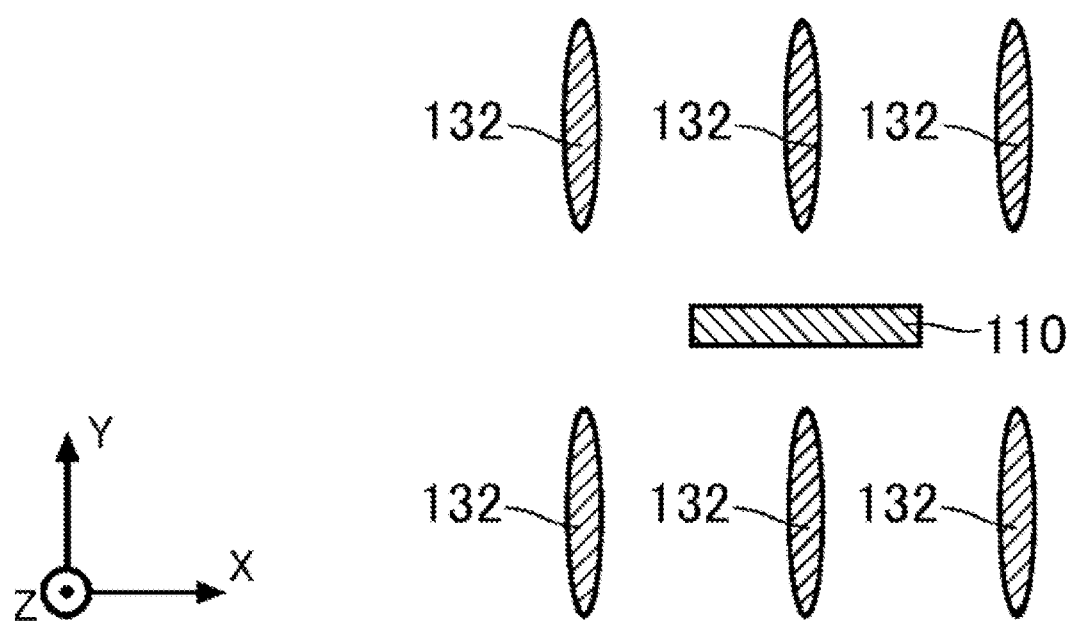
FIG. 7 is a figure showing another exemplary relationship between the temperature detecting portion 110 and connecting parts 132.

FIG. 7 is a figure showing another exemplary relationship between the temperature detecting portion 110 and connecting parts 132. Although in the examples of FIG. 1 to FIG. 6, connecting parts 132 have longitudinal sides extending in the X-axis direction, connecting parts 132 in the present example have longitudinal sides extending in the Y-axis direction. In addition, at least one connecting part 132 having a longitudinal side extending in the Y-axis direction may be arranged to face the temperature detecting portion 110 in the X-axis direction. In addition, a connecting part 132 facing the temperature detecting portion 110 in the Y-axis direction may have a longitudinal side extending in the X-axis direction, and a connecting part 132 facing the temperature detecting portion 110 in the X-axis direction may have a longitudinal side extending in the Y-axis direction. With such a structure, connecting parts 132 can be arranged to surround the temperature detecting portion 110.

Figure 8:
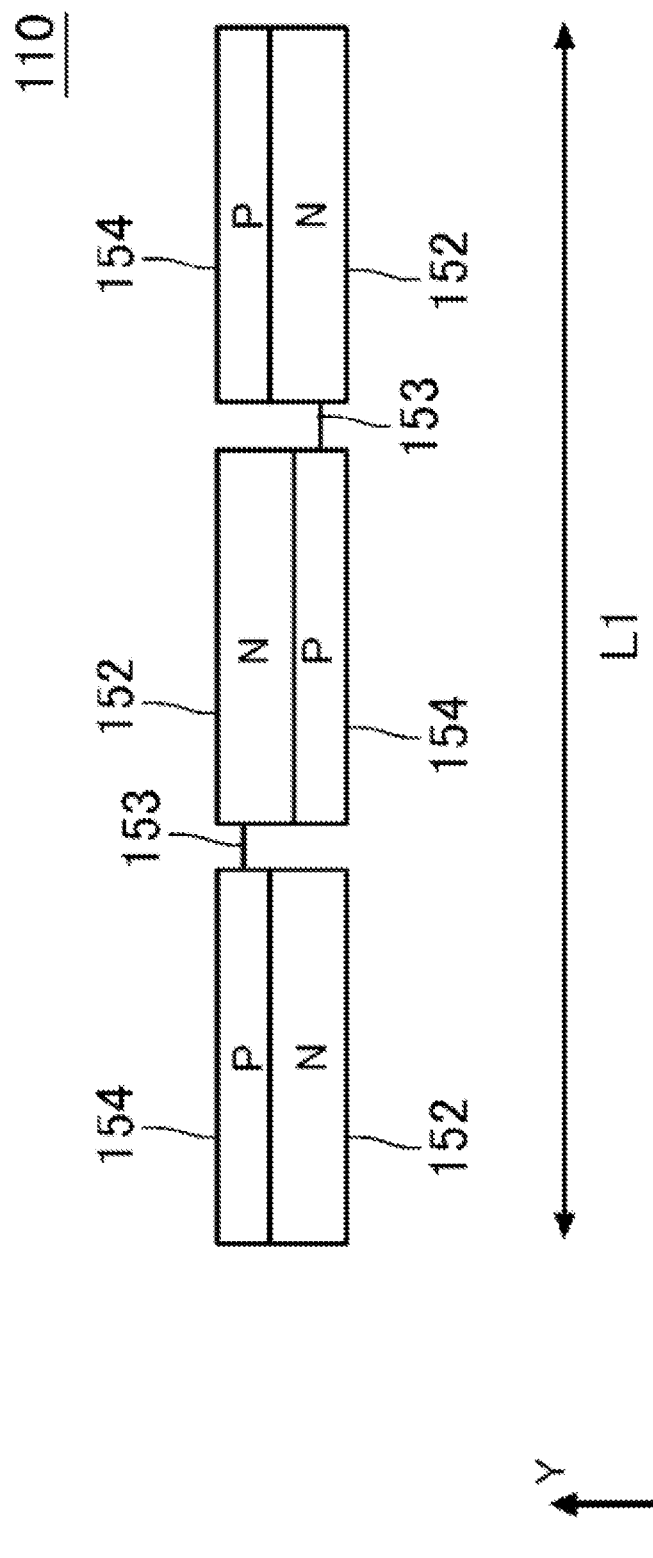
FIG. 8 is a figure showing an exemplary structure of the temperature detecting portion 110 on an X-Y plane.

FIG. 8 is a figure showing an exemplary structure of the temperature detecting portion 110 on an X-Y plane. The temperature detecting portion 110 in the present example has a structure in which one or more P-N junctions between P type regions 154 and N type regions 152 are arrayed in the longitudinal direction (the X-axis direction in the present example). The individual P-N junctions are electrically connected in series by lines 153.

The detecting-portion length L1 of the temperature detecting portion 110 may be the distance between both ends of the P-N junctions in the longitudinal direction. The distance may include the lengths of the lines 153 connecting the P-N junctions in series.

Figure 9:
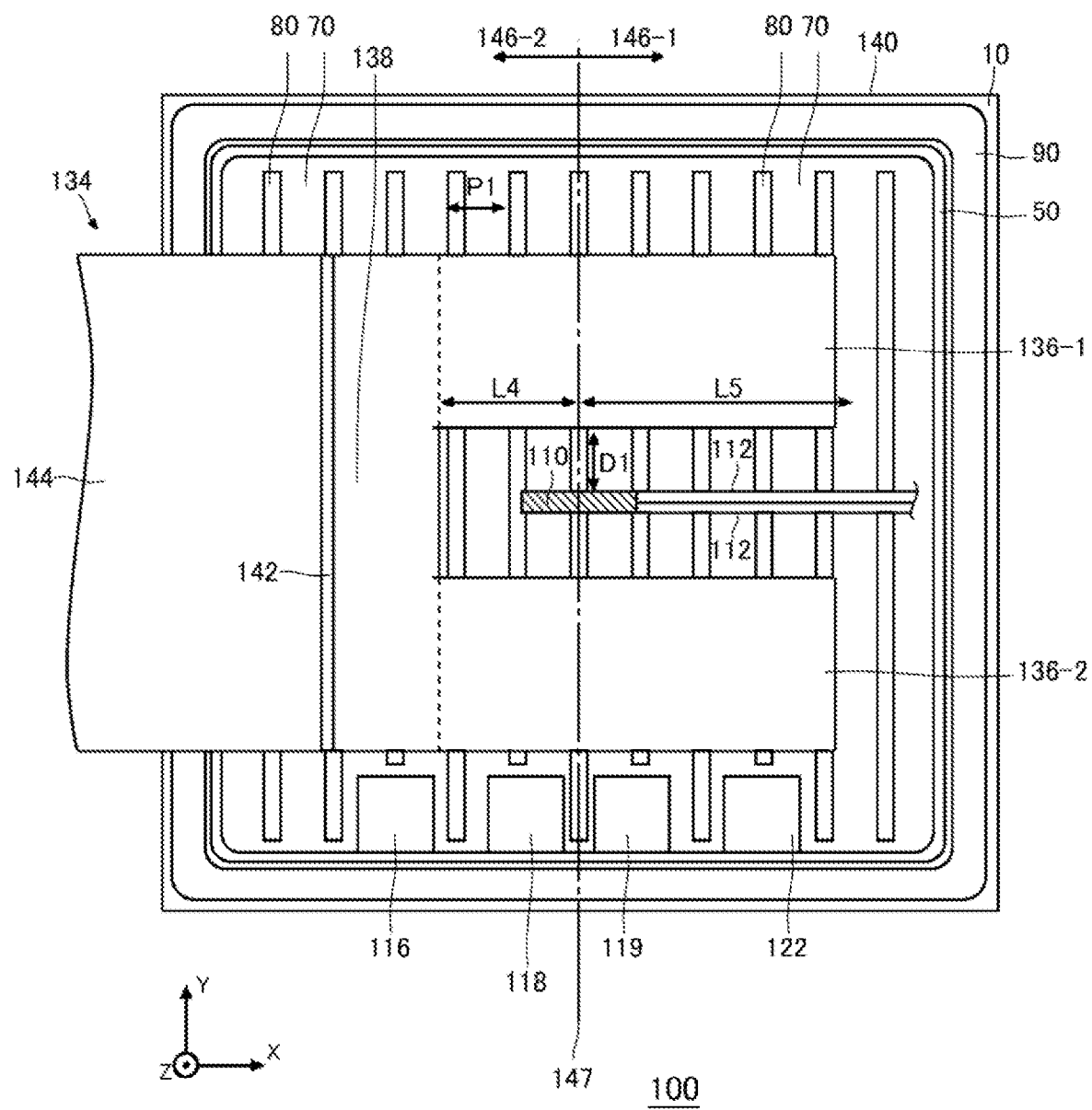
FIG. 9 is a schematic view showing another structure of the top surface of the semiconductor device 100.

FIG. 9 is a schematic view showing another structure of the top surface of the semiconductor device 100. An external line in the present example is a lead frame 134. The lead frame 134 includes a tabular conductive member extending parallel to an X-Y plane. The lead frame 134 in the present example has: a first part 136 and a second part 138 in contact with the semiconductor device 100; a leg portion 142 extending from the second part 138 in a direction away from the semiconductor substrate 10 (the Z-axis direction in the present example); and a bridging portion 144 that extends from the leg portion 142 toward another circuit element.

The first part 136 and second part 138 in the present example are formed integrally. The first part 136 and second part 138 correspond to connecting parts 132 to connect with the semiconductor substrate 10.

The distance D1 between the first part 136 and second part 138, and the temperature detecting portion 110 satisfies the same condition as the above-mentioned condition about the distance D1 between the connecting parts 132 and the temperature detecting portion 110. For example, the distance D1 is equal to or shorter than 500% of the array pitch P1. Note that the distance D1 between the temperature detecting portion 110, and the first part 136 and second part 138 is the distance between the temperature detecting portion 110 and an end portion which is among end portions of the first part 136 and the second part 138 and is closest to the temperature detecting portion 110.

In the present example, two first parts 136 are arranged to sandwich the temperature detecting portion 110 in the direction (the Y-axis direction in the present example) perpendicular to the longitudinal direction (the X-axis direction in the present example) of the temperature detecting portion 110. The temperature detecting portion 110 may be arranged at the middle, in the Y-axis direction, of a region between the two first parts 136.

The width of each first part 136 in the X-axis direction may be greater than the width of the temperature detecting portion 110 in the X-axis direction. A partial region of a first part 136 may be arranged to face a portion of the temperature detecting line 112 in the Y-axis direction.

The second part 138 connects the two first parts 136. The second part 138 in the present example is arranged opposite to the temperature detecting line 112 when seen from above with respect to the temperature detecting portion 110. In one example, if the top surface of the semiconductor substrate 10 is divided into two regions 146-1, 146-2 by a straight line 147 that passes the center of the temperature detecting portion 110 and is parallel to the Y-axis, the temperature detecting line 112 and the second part 138 are arranged in different regions 146. In the example of FIG. 9, the second part 138 is arranged in the region 146-2, and the temperature detecting line 112 is arranged in the region 146-1. The second part 138 and temperature detecting line 112 may be arranged to sandwich the temperature detecting portion 110 in the X-axis direction.

With such a structure, the first parts 136 and second part 138 can be arranged avoiding the temperature detecting portion 110 and temperature detecting line 112 while the first parts 136 or second part 138 are arranged to surround the temperature detecting portion 110.

Note that the length L4, in the X-axis direction, of parts which constitute the first parts 136 and are arranged in the region 146-2 may be shorter than the length L5, in the X-axis direction, of parts which constitute the first parts 136 and are arranged in the region 146-1. In other words, the first parts 136 extend longer on the temperature detecting line 112 side in the X-axis direction with respect to the straight line 147. Thereby, larger parts of the first parts 136 can surround the temperature detecting portion 110.

Figure 10:
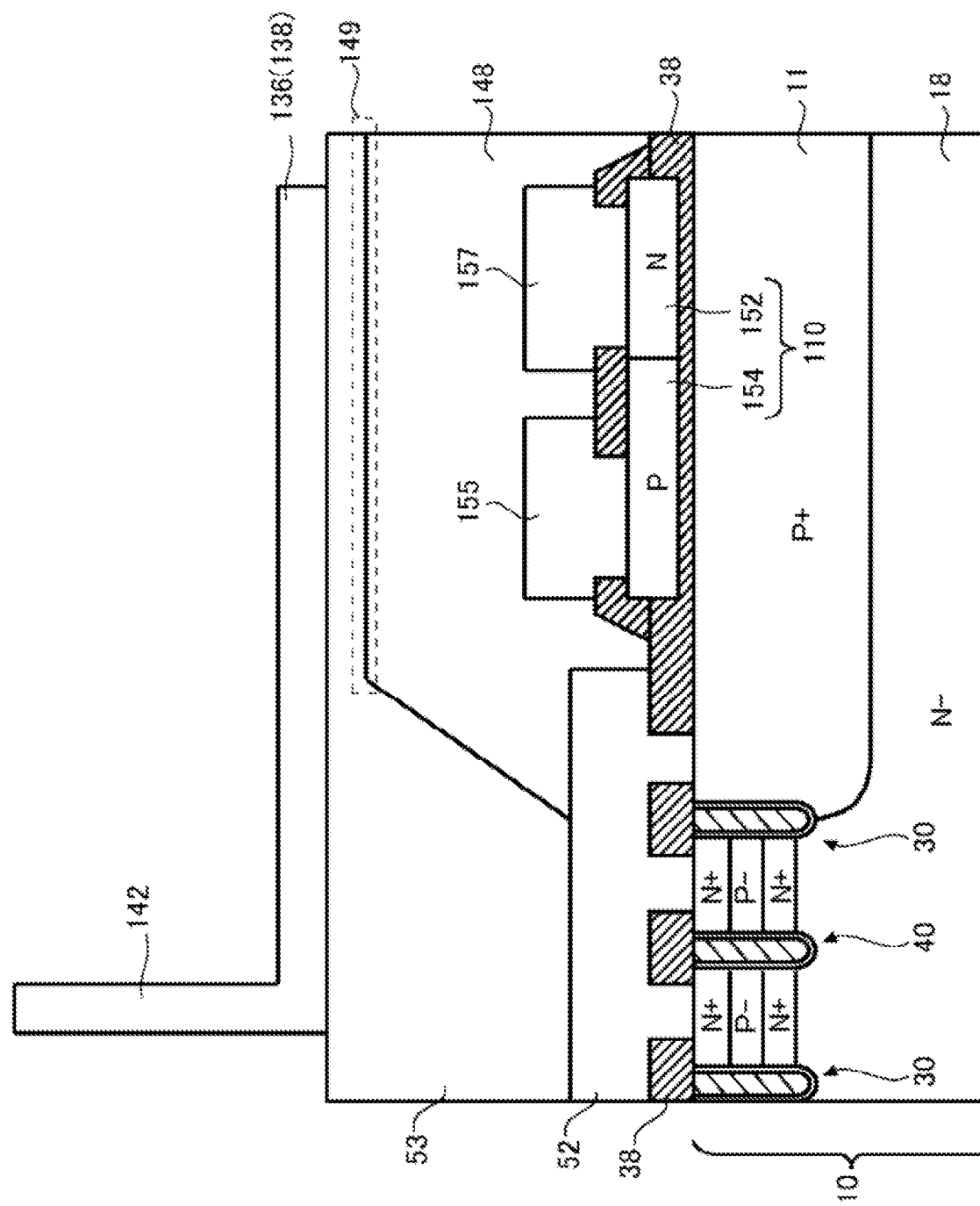
FIG. 10 is a figure showing the arrangement of a first part 136 or second part 138 in a comparative example.

FIG. 10 is a figure showing the arrangement of the first part 136 or second part 138 in a comparative example. In the comparative example, at least one of the first part 136 and second part 138 is arranged to overlap at least one of the temperature detecting portion 110 and the temperature detecting line 112. In the example shown in FIG. 10, the first part 136 or second part 138 is arranged to overlap the temperature detecting portion 110. Note that the semiconductor device 100 explained with reference to FIG. 1 to FIG. 9 may also have the structure shown in FIG. 10 in other respects than the structure about arrangement of the first part 136 or second part 138.

A metal layer 155 and a metal layer 157 are provided on a P type region 154 and an N type region 152 of the temperature detecting portion 110. The metal layer 155 and metal layer 157 may function as the lines 153 shown in FIG. 8, for example. The temperature detecting portion 110, metal layer 155 and metal layer 157 are covered with a protective film 148 formed of polyimide or the like.

The emitter electrode 52 is provided above the semiconductor substrate 10. A partial region of the emitter electrode 52 may be covered with the protective film 148. The solder layer 53 is provided on the emitter electrode 52 and protective film 148. The solder layer 53 functions as a portion of a top surface electrode. The first part 136 or second part 138 in the present example is connected to the top surface of the solder layer 53.

The adhesion between the solder layer 53 and the protective film 148 at an interface 149 is lower than the adhesion of the combination of the solder layer 53 and the emitter electrode 52 or the combination of the solder layer 53 and the first part 136 (or the second part 138). If the first part 136 or the like is arranged above the temperature detecting portion 110 or the like, the interface 149 easily receives stress due to the differences in linear expansion coefficients among the first part 136, solder layer 53, protective film 148 and semiconductor substrate 10. Because of this, the protective film 148 may be peeled off of the solder layer 53 at the interface 149 in some cases.

In contrast, according to the semiconductor device 100 shown in FIG. 9, the first parts 136 and second part 138 are arranged such that the temperature detecting portion 110 and temperature detecting line 112 do not overlap. Because of this, it is possible to suppress peeling of the protective film 148 from the solder layer 53.

Figure 11:
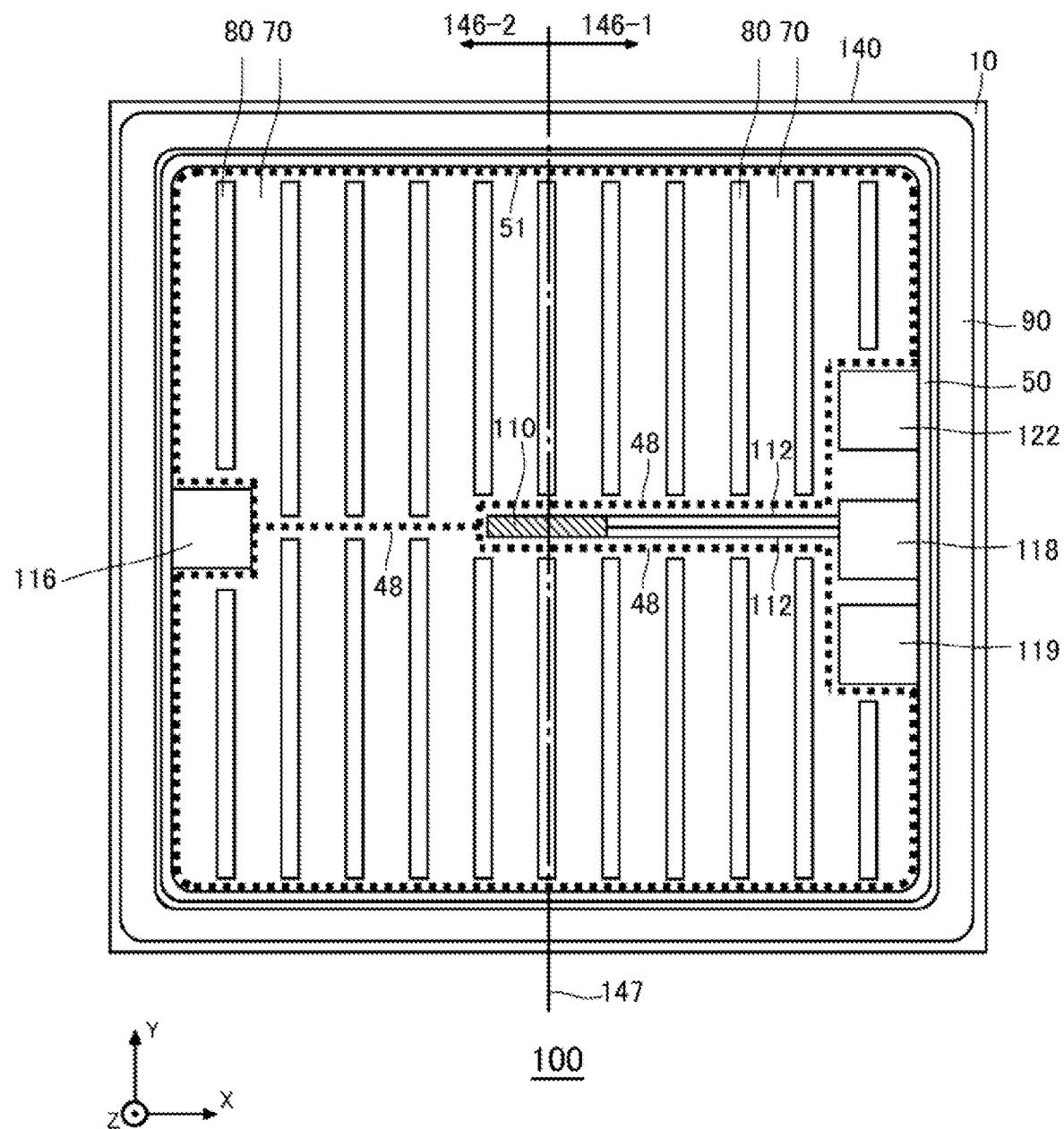
FIG. 11 is a schematic view showing another structure of the top surface of the semiconductor device 100.

FIG. 11 is a schematic view showing another structure of the top surface of the semiconductor device 100. Although external lines and connecting parts are omitted in FIG. 11, the configuration of external lines and connecting parts are the same as any of the aspects explained with reference to FIG. 1 to FIG. 9. However, individual pads and individual connecting parts are arranged not to overlap.

In the present example, the gate pad 116 is arranged opposite to the temperature detecting line 112 when seen from above with respect to the temperature detecting portion 110. In one example, if the top surface of the semiconductor substrate 10 is divided into two regions 146-1, 146-2 by a straight line 147 that passes the center of the temperature detecting portion 110 and is parallel to the Y-axis, the temperature detecting line 112 and the gate pad 116 are arranged in different regions 146. In the example of FIG. 11, the gate pad 116 is arranged in the region 146-2, and the temperature detecting line 112 are arranged in the region 146-1. The gate pad 116 and temperature detecting line 112 may be arranged to sandwich the temperature detecting portion 110 in the X-axis direction. That is, the gate pad 116 may be arranged on an imaginary straight line which extends from the temperature detecting line 112 in the X-axis direction.

In addition, the sense emitter pad 122 may be arranged opposite to the gate pad 116 with respect to the temperature detecting portion 110. The sense emitter pad 122 in the present example is arranged in the region 146-1. In addition, the cathode pad 118 and anode pad 119 may also be arranged opposite to the gate pad 116. In other words, the cathode pad 118 and anode pad 119 are arranged on the same side as the temperature detecting line 112. Thereby, the temperature detecting line 112 can be easily connected with cathode pad 118 and anode pad 119.

The semiconductor device 100 may have a gate runner 48 lying from the gate pad 116 toward the temperature detecting portion 110 on an X-Y plane. The gate runner 48 may have the same structure as that of the gate runner 51. That is, the gate runner 48 may be a semiconductor line formed of polysilicon doped with impurities or the like.

The gate runner 48 may branch off in two directions, the Y-axis direction positive side and the Y-axis direction negative side, at a position at which it faces an end portion of the temperature detecting portion 110. The two gate runners 48 may be provided to be parallel in the X-axis direction along the temperature detecting portion 110 and temperature detecting line 112. The gate runners 48 bypass individual pads on an X-Y plane and are connected with the gate runner 51.

By arranging the gate runner 48 above the active portion 120, less delayed and less attenuated gate voltage can be applied also to a region apart from the gate runner 50 and gate runner 51. In addition, since according to the pad arrangement in the present example, the gate runner 48 is provided along the temperature detecting line 112 and the like, loss of the area of the active portion 120 caused by providing the gate runner 48 and loss of the area of the active portion 120 caused by providing the temperature detecting line 112 can be minimized.

Figure 12:
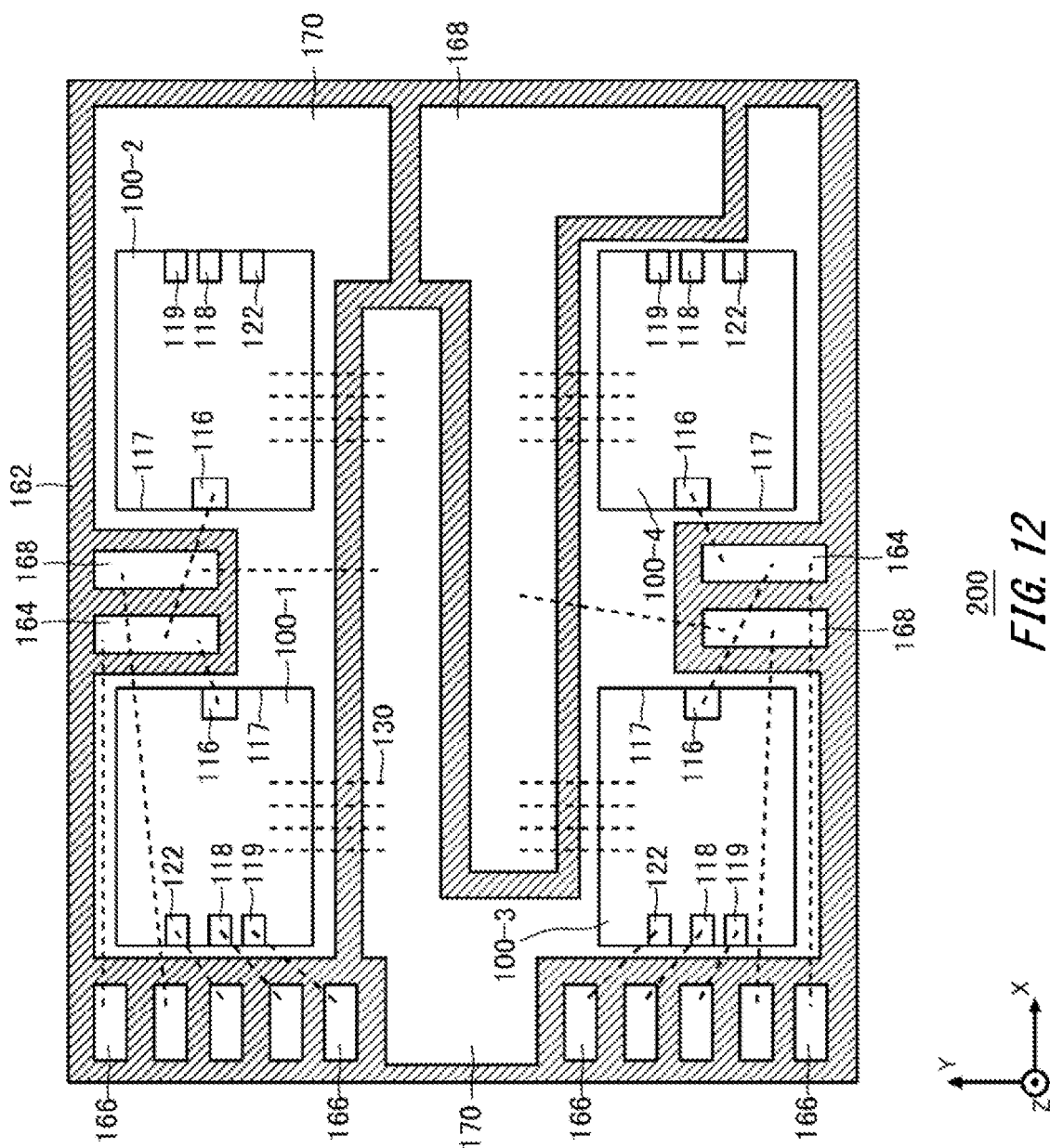
FIG. 12 is a figure showing an exemplary semiconductor package 200 according to one embodiment of the present invention.

FIG. 12 is a figure showing an exemplary semiconductor package 200 according to one embodiment of the present invention. The semiconductor package 200 includes one or more semiconductor devices 100 and external circuits. The semiconductor package 200 in the present example has a circuit board 162 provided with line patterns (164, 166, 168, 170) as external circuits. The line patterns may be thin films formed of a conductive material such as copper. The external lines 130 establish connections between the line patterns and between the semiconductor device 100 and the line patterns. Instead of some of or all the external lines 130, the lead frame 134 may be used.

The semiconductor devices 100 in the present example may have the pad arrangement shown in FIG. 11. The individual semiconductor devices 100 may be connected onto line patterns 170 by soldering or the like. In the semiconductor devices 100 in the present example, the collector electrodes 24 are connected to the line patterns 170. In the individual line patterns 170, a plurality of semiconductor devices 100 may be connected in parallel. In addition, semiconductor devices 100 provided in different line patterns 170 may be connected in series. In other words, semiconductor devices 100 provided in different line patterns 170 may be connected to each other with an emitter electrode 52 of one of them being electrically connected to a collector electrode 24 of the other of them. In addition, a line pattern 168 is connected with emitter electrodes 52 of a plurality of the semiconductor devices 100 provided in a single line pattern 170. Line patterns 168 may be connected to the outside via line patterns 166.

In the present example, an end side which is among individual end sides of a semiconductor device 100 when seen from above and is closest to a gate pad 116 is referred to as a gate pad end side 117. Two semiconductor devices 100 arranged in a single line pattern 170 may be arranged with their gate pad end sides 117 facing each other.

A line pattern 164 is provided between two gate pad end sides 117. Gate pads 116 of two semiconductor devices 100 are connected to a common line pattern 164. The line pattern 164 is arranged between the two gate pad end sides 117. With such arrangement, common gate voltage can be applied to the two semiconductor devices 100 with simple lines. In addition, since it is only required to provide a common line pattern 164 to the two semiconductor devices 100, the devices can be miniaturized.

In addition, in one (semiconductor devices 100-1, 100-3 in the present example) of semiconductor devices 100 that are arranged in a single line pattern 170, a sense emitter pad 122, a cathode pad 118 and an anode pad 119 are connected to a line pattern 166. The line pattern 166 is a pad connected to an external device. Since in the semiconductor devices 100 in the present example, gate pads 116 and other pads are arranged to be opposite to each other, sense emitter pads 122, cathode pads 118 and anode pads 119 can be arranged near line patterns 166.

Note that in the other (semiconductor devices 100-2, 100-4 in the present example) of semiconductor devices 100 that are arranged in a single line pattern 170, a cathode pad 118 and an anode pad 119 need not be connected to a line pattern 166. In the present example, temperature detection is not performed on the semiconductor device 100.

Figure 13:
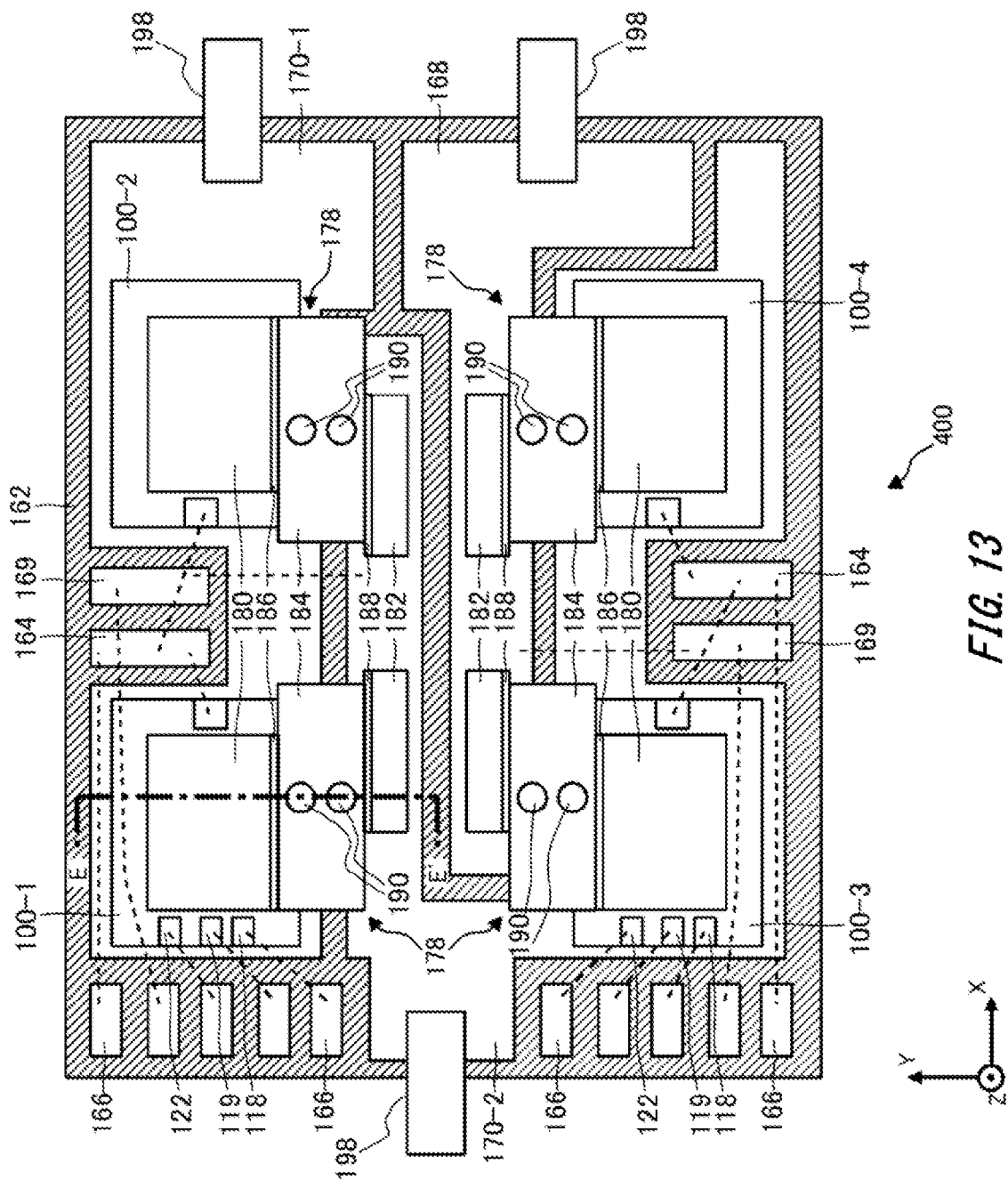
FIG. 13 is a figure showing an exemplary top surface of a semiconductor module 400 according to one embodiment of the present invention.

FIG. 13 is a figure showing an exemplary top surface of a semiconductor module 400 according to one embodiment of the present invention. Note that although, in the semiconductor module 400, the arrangement of anode pads 119 and cathode pads 118 are reversed from the arrangement of anode pads 119 and cathode pads 118 in FIG. 12, the anode pads 119 in FIG. 12 and the anode pads 119 in FIG. 13 have the same functions, and the cathode pads 118 in FIG. 12 and the cathode pads 118 in FIG. 13 have the same functions, so that the same signs are given to them. In addition, an upper arm line pattern is referred to as a line pattern 170-1, and a lower arm line pattern is referred to as a line pattern 170-2. Line patterns which are gate terminals are referred to as line patterns 164, and line patterns which are relay terminals to control terminals mentioned below are referred to as line patterns 166.

The semiconductor module 400 in the present example includes lead frames 178. Semiconductor devices 100 are plated chips having plated surfaces as mentioned above, and are arranged on the predetermined line patterns 170-1, 170-2. A lead frame 178 has one end bonded to a plated chip, and the other end bonded to the line patterns 168, 170-2 which are external circuits. A lead frame 178 in the present example has: a first contacting portion 180 in contact with a semiconductor device 100; a second contacting portion 182 in contact with the line patterns 168, 170-2; a bridging portion 184 that bridges the first contacting portion 180 and the second contacting portion 182 above the circuit board 162; a leg portion 186 connecting the first contacting portion 180 to the bridging portion 184; and a leg portion 188 connecting the second contacting portion 182 to the bridging portion 184. The first contacting portion 180, second contacting portion 182 and bridging portion 184 may be constituted by conductive tabular members that are parallel to an X-Y plane. The bridging portion 184 may be a convex portion protruding away from the surface of a semiconductor device 100.

The semiconductor module 400 in the present example has a molded portion 192 (please see FIG. 14) as cladding on its surface. The molded portion 192 is constituted by a gelled resin or the like.

In the bridging portion 184, an opening 190 for injecting the resin of the molded portion 192 is provided below the bridging portion 184. The bridging portion 184 in the present example is provided with a plurality of openings 190 therein and around the middle thereof. Thereby, the gelled resin constituting the molded portion 192 can be surely distributed above and below the lead frame 178. Note that the line pattern 170-1, line pattern 170-2 and line pattern 168 may be provided with drawing portions 198 that electrically connect to main terminals outside the semiconductor module 400.

Figure 14:
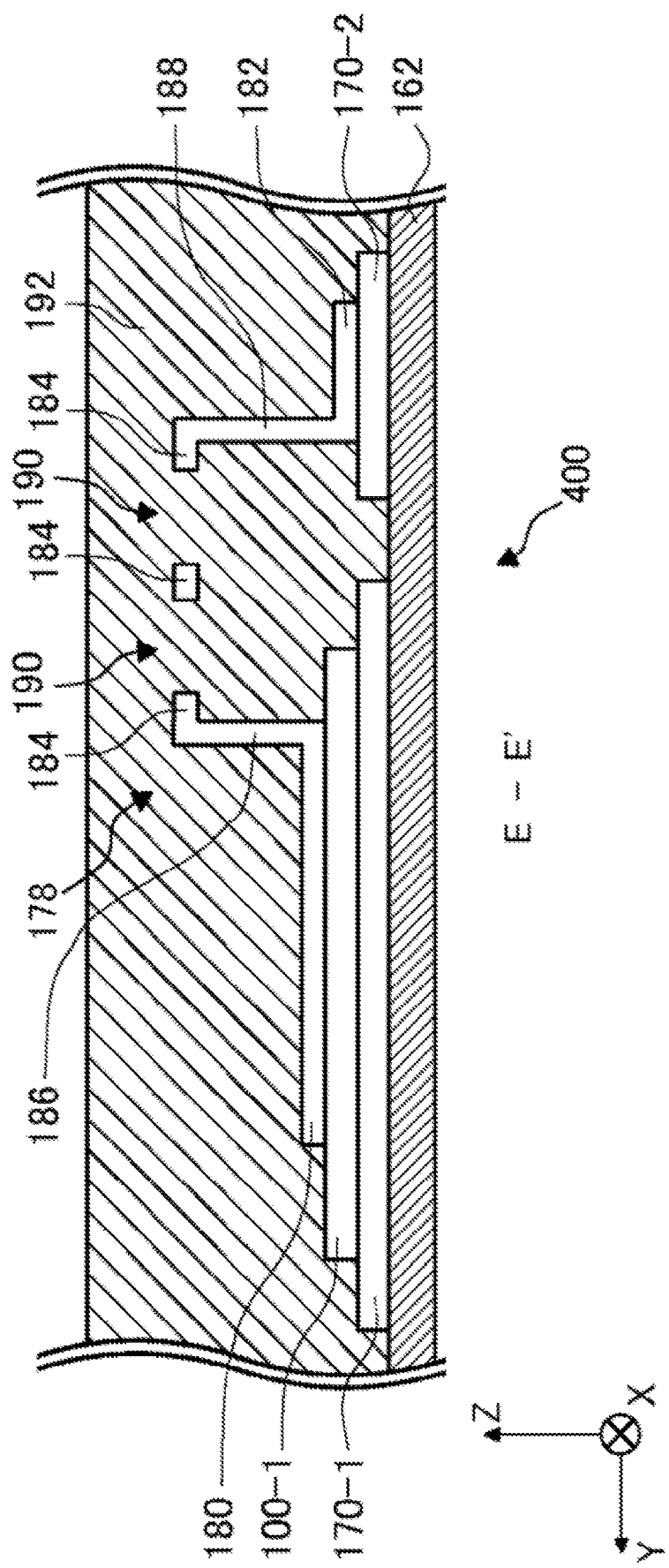
FIG. 14 is a figure showing an exemplary cross-section taken along E-E' in FIG. 13.

FIG. 14 is a figure showing an exemplary cross-section taken along E-E' in FIG. 13. The E-E' cross-section is a Y-Z plane passing through an opening 190 provided in a lead frame 178. As shown in FIG. 14, the lead frame 178 has one end connected with the semiconductor device 100-1 provided above the line pattern 170-1. In addition, the lead frame 178 has the other end connected with the line pattern 170-2. A first contacting portion 180 is arranged above the semiconductor device 100-1. A second contacting portion 182 is arranged above the line pattern 170-2. The semiconductor devices 100-1, 100-2, 100-3, 100-4 in the present example are so-called plated chips having plated surfaces. A bridging portion 184 is connected with a first contacting portion 180 by a leg portion 186, and is connected with a second contacting portion 182 by a leg portion 188. As mentioned above, since the opening 190 is provided in the bridging portion 184, the space defined by the leg portion 186, leg portion 188 and bridging portion 184 is also filled with a gelled resin for the molded portion 192. The molded portion 192 may be constituted for example by another material such as an epoxy resin or the like. Note that in order to improve the adhesion with the molded portion 192, any one of or multiple ones among the first contacting portion 180, second contacting portion 182, leg portion 186 and leg portion 188 may be provided with an opening(s) 190.

Note that the semiconductor devices 100-1, 100-2, 100-3, 100-4 in the present example may each be the semiconductor devices 100 having the temperature detecting portion 110 shown in FIG. 9. In such a case, the lead frame 178 in the present example may be the lead frame 134 not overlapping the temperature detecting portion 110 shown in FIG. 9. That is, the lead frame 178 may be bonded to the surface of the semiconductor device 100 to sandwich the temperature detecting portion 110. The lead frame 178 has an integrally formed first part 136 and second part 138, and the first part 136 or second part 138 may be arranged to surround the temperature detecting portion 110.

Figure 15:
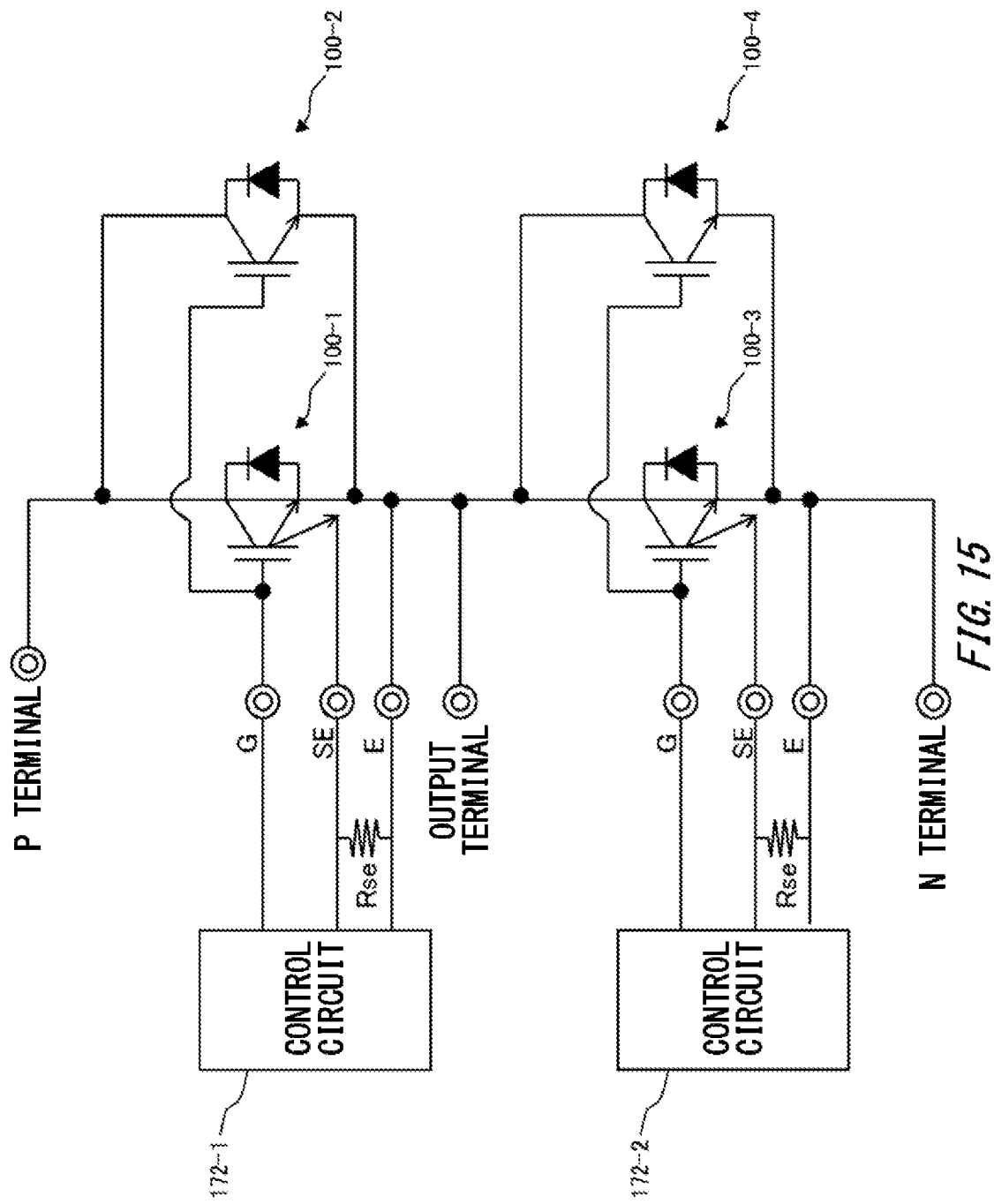
FIG. 15 is a schematic circuit diagram including a connection relation between an upper arm and a lower arm of a semiconductor module according to one embodiment of the present invention.

FIG. 15 is a schematic circuit diagram including a connection relation between an upper arm and a lower arm of a semiconductor module according to one embodiment of the present invention. As shown in FIG. 15, the semiconductor device 100-1 and semiconductor device 100-2 are connected in parallel to constitute an upper arm. The semiconductor device 100-3 and semiconductor device 100-4 are connected in parallel to constitute a lower arm. In the present example, one arm is constituted by two semiconductor devices 100. The upper arm including the semiconductor device 100-1 and semiconductor device 100-2, and the lower arm including the semiconductor device 100-3 and semiconductor device 100-4 are connected in series. The semiconductor device 100-1 and semiconductor device 100-3 are arranged on the X-axis negative side of the semiconductor module 400 as shown in FIG. 13. The semiconductor device 100-2 and semiconductor device 100-4 are arranged on the X-axis positive side of the semiconductor module 400 as shown in FIG. 13.

One of control circuits, a control circuit 172-1, is connected to the semiconductor device 100-1 and semiconductor device 100-2. The control circuit 172-1 supplies gate voltage to the semiconductor device 100-1 and semiconductor device 100-2. In addition, the other of the control circuits, a control circuit 172-2, is connected to the semiconductor device 100-3 and semiconductor device 100-4. The control circuit 172-2 may have similar functions to those of the control circuit 172-1.

The sense emitter terminal (SE) is connected to the sense emitter pad 122. The emitter terminal (E) is connected to the emitter electrode 52. The control circuit 172-1 and control circuit 172-2 each detect current flowing between the sense emitter terminal (SE) and the emitter terminal (E) via sense resistance Rse. Other than them, the control circuits 172-1, 172-2 may each have a temperature detecting circuit to detect temperature based on voltage changes in a temperature sense diode of the temperature detecting portion 110 connected to the anode pad 119 and the cathode pad 118.

Figure 16:
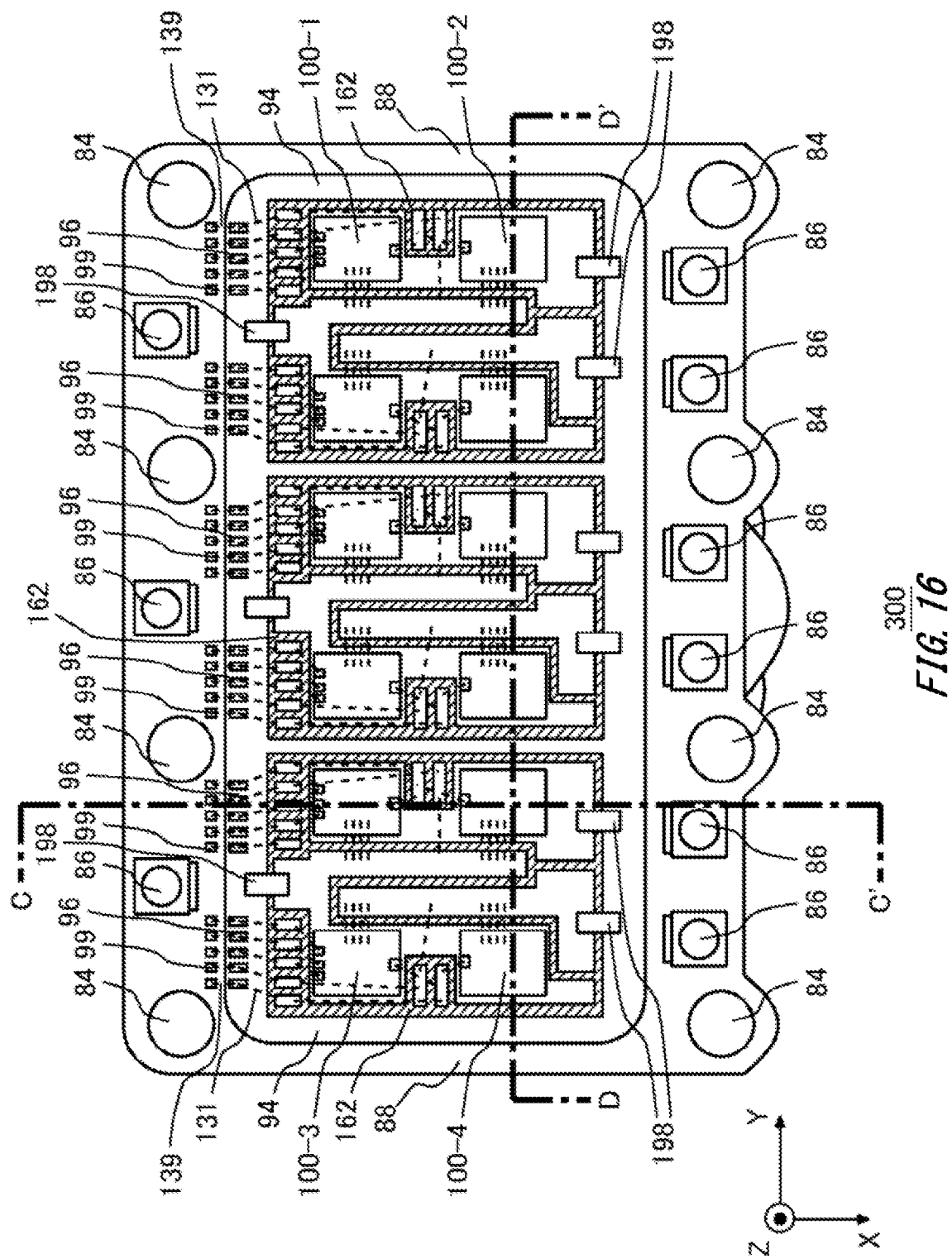
FIG. 16 is a figure showing an exemplary top surface of a semiconductor module 300 according to one embodiment of the present invention.

FIG. 16 is a figure showing an exemplary top surface of a semiconductor module 300 according to one embodiment of the present invention. As shown in FIG. 16, the semiconductor module 300 in the present example includes a housing 88. The housing 88 has main terminals 86 such as U, V, W, P or N terminals, and control terminals 99 such as G (gate), Se (sense emitter), A (anode) or K (cathode) terminals. The circuit board 162 having a line pattern 170 is mounted above a bottom surface 94 of the housing 88. The circuit board 162 is formed by bonding a copper circuit board onto an alumina ceramics substrate, for example. The semiconductor module 300 in the present example is for driving a three-phase motor, for example, and is of so-called 6-in-1 type having six arms. Three circuit boards 162 are mounted in the housing 88 in line in the Y-axis direction. Each circuit board 162 includes upper and lower arms constituting outputs to the individual U, V and W main terminals 86. In addition, each arm has two semiconductor devices 100 connected in parallel, as shown in FIG. 15.

The housing 88 has relay terminals 96 for connection with line patterns 166. The line patterns 166 and the relay terminals 96 are connected through lines 131. Note that the sense emitter pad 122, cathode pad 118 and anode pad 119 also may be connected to line patterns 166 through similar lines 131. In addition, the housing 88 has control terminals 99. Each relay terminal 96 is connected with each control terminal 99 through a line 139. Unlike the lines 131, the lines 139 may not be wires or the like, but may be metal lines or the like embedded within the housing 88. In the present example, the control terminals 99 are provided on the X-axis negative side of the circuit board 162, and are not provided on the X-axis positive side. Such arrangement is possible because detecting portions 108 (please see FIG. 20) of the semiconductor devices 100-2, 100-4 arranged on the other side in terms of the flow path direction, that is, on the upstream side are not connected to the control terminals 99. Thereby, the assemblability, with the control circuits 172-1, 172-2, of gate driving circuits or the like to which the control terminals 99 are connected can be improved, and the layout arrangement can be simplified.

The number of the control terminals 99 may be the same as the numbers of the relay terminals 96 and line patterns 166. In the present example, five line patterns 166 and relay terminals 96 corresponding to the semiconductor device 100-1 and semiconductor device 100-2 are provided, and five line patterns 166 and relay terminals 96 corresponding to the semiconductor device 100-3 and semiconductor device 100-4 are provided.

A cooling portion through which a coolant is caused to flow in a predetermined flow path direction is arranged below the housing 88. The cooling portion is arranged below the bottom surface 94, and is arranged at a position that cannot be recognized visually when seen from above in FIG. 16. In addition, the housing 88 may have through-holes 84 for fixing the semiconductor module 300 to an external device.

Figure 17:
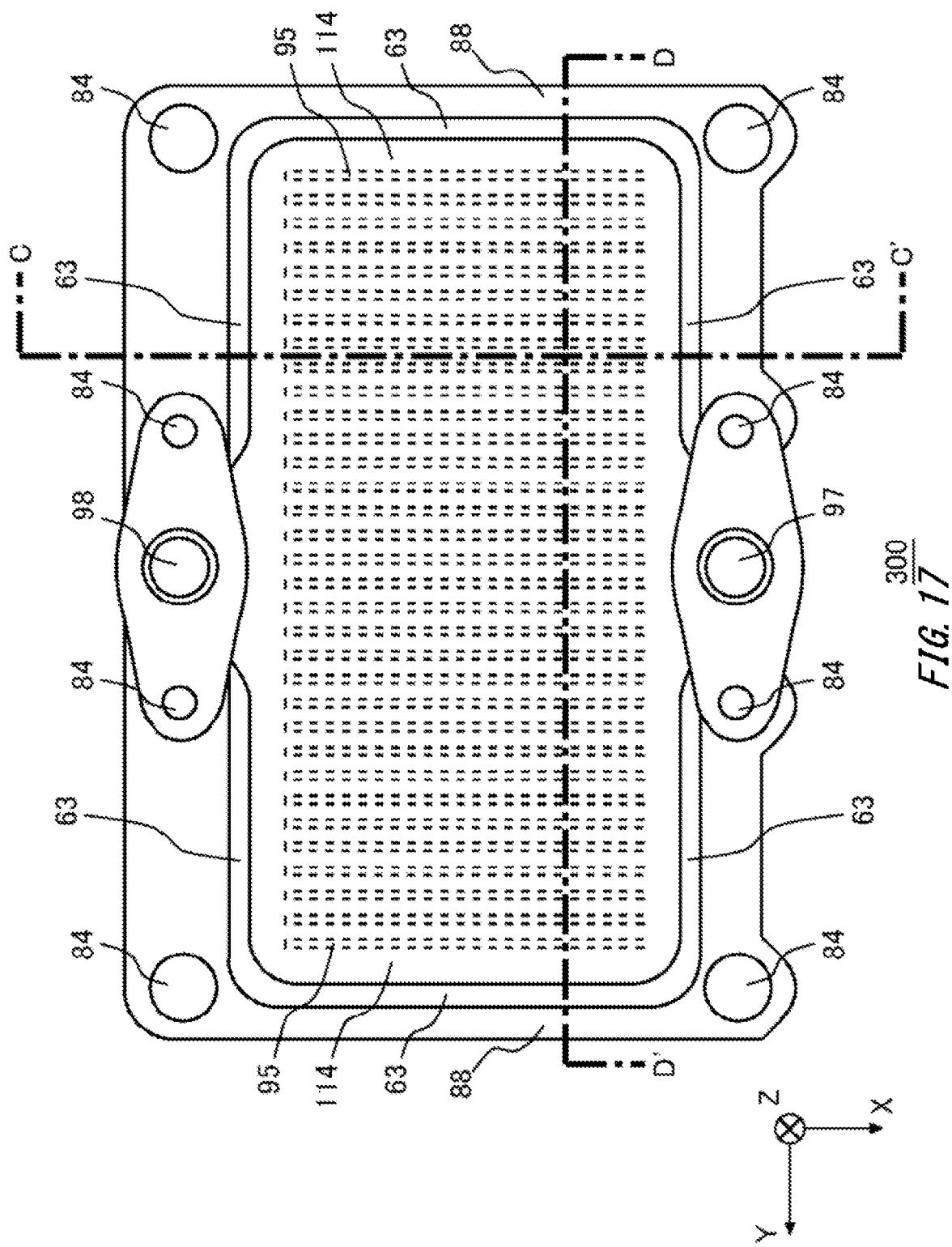
FIG. 17 is a figure showing an exemplary rear surface of the semiconductor module 300 according to one embodiment of the present invention.

FIG. 17 is a figure showing an exemplary rear surface of the semiconductor module 300 according to one embodiment of the present invention. FIG. 17 is a figure showing the semiconductor module 300 as seen from the side opposite, in the Z-axis direction, to the top surface view in FIG. 16, that is, as seen from the Z-axis negative side to the Z-axis positive side. As shown in FIG. 17, the housing 88 has a cooling portion 114. The cooling portion 114 has a side wall 63. The cooling portion 114 is provided with a space surrounded by the side wall 63. A coolant flows through the space. In the space, the cooling portion 114 may be provided with a plurality of cooling fins 95 arranged along the X-axis direction.

The housing 88 has a coolant inlet 97 for letting in a coolant into the cooling portion 114, and a coolant outlet 98 for letting out the coolant from the cooling portion 114. Accordingly, one of the sides that is closer to the coolant outlet 98 is the downstream side, and the other of the sides that is closer to the coolant inlet 97 is the upstream side. Although, in the present example, the semiconductor module 300 has one coolant inlet 97 and one coolant outlet 98, it may have a plurality of coolant inlets 97 and a plurality of coolant outlets 98.

The coolant inlet 97 and coolant outlet 98 may be provided at two sides, respectively, facing in the X-axis direction or Y-axis direction. In the present example, the coolant inlet 97 is on the X-axis positive side, and the coolant outlet 98 is on the X-axis negative side.

Figure 18:
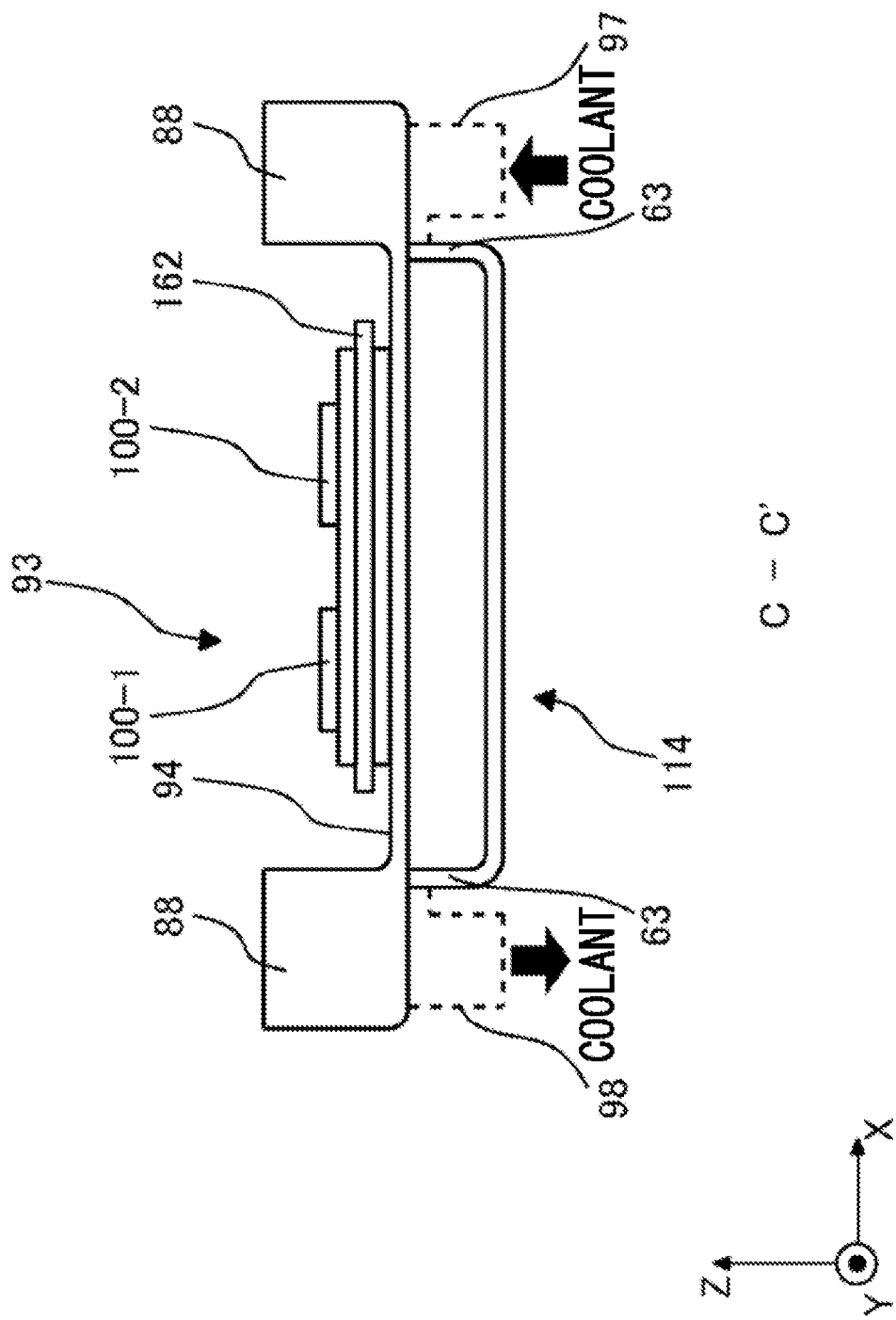
FIG. 18 is a figure showing an exemplary cross-section taken along C-C' in FIG. 16 and FIG. 17.

FIG. 18 is a figure showing an exemplary cross-section taken along C-C' in FIG. 16 and FIG. 17. The C-C' cross-section is an X-Z plane passing through the semiconductor device 100-1 and semiconductor device 100-2. As shown in FIG. 18, the housing 88 is provided with a depression 93 for mounting the circuit board 162 having the line pattern 170. That is, the circuit board 162 is arranged at the bottom surface 94 of the depression 93. The circuit board 162 may have thereabove the semiconductor device 100-1 and semiconductor device 100-2. The depth of the depression 93 may be greater than the thicknesses of the semiconductor devices 100-1, 100-2 and circuit board 162. Note that in FIG. 18 and FIG. 19, illustration of the molded portion 192 covering the semiconductor devices 100-1, 100-2 is omitted for convenience.

The housing 88 has the cooling portion 114 below the bottom surface 94. The housing 88 has the coolant inlet 97 and the coolant outlet 98. Since the C-C' cross-section does not pass through the coolant inlet 97 and coolant outlet 98, the positions of the coolant inlet 97 and coolant outlet 98 on the X-Z plane in FIG. 18 are indicated with broken line portions. Coolant advances inside the cooling portion 114 from the X-axis positive side to the X-axis negative side. The dual-parallel semiconductor devices 100-1, 100-2 may be arranged in parallel to the direction of the flow of the coolant.

Figure 19:
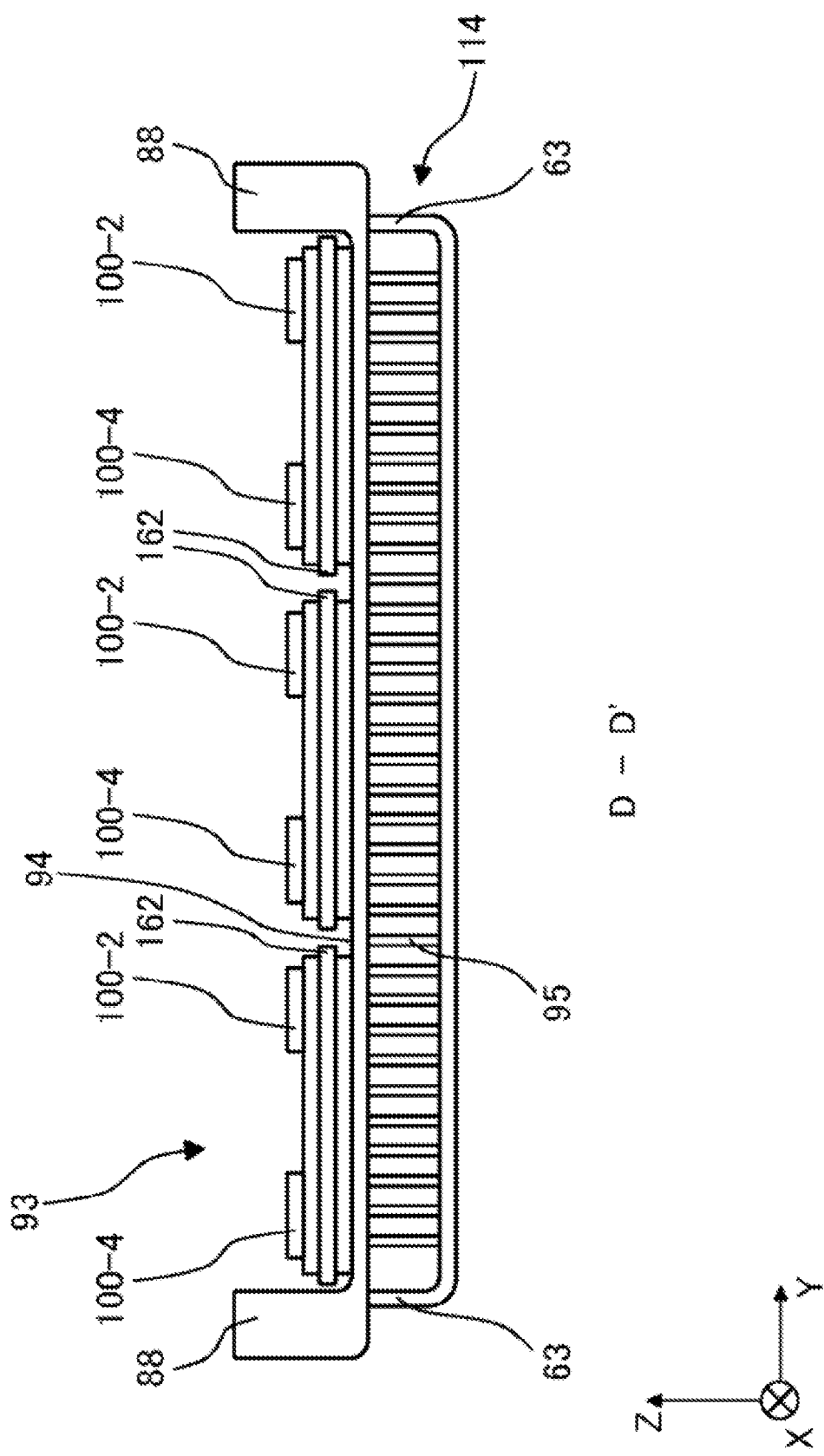
FIG. 19 is a figure showing an exemplary cross-section taken along D-D' in FIG. 16 and FIG. 17.

FIG. 19 is a figure showing an exemplary cross-section taken along D-D' in FIG. 16 and FIG. 17. The D-D' cross-section is a Y-Z plane passing through the semiconductor device 100-2 and semiconductor device 100-4. In the present example, in the Y-axis direction, three circuit boards 162 are arranged at the bottom surface 94 of the depression 93. The cooling portion 114 may be provided with a plurality of cooling fins 95. The cooling fins 95 may lie from the lower end of the space inside the cooling portion 114 in the Z-axis direction to its upper end of the space.

If the cooling fins 95 are provided in the cooling portion 114, coolant advances in the X-axis direction between adjacent cooling fins 95. Because of this, the coolant flow path direction may be the extending direction of the cooling fins 95 (the X-axis direction). If the cooling fins 95 are not provided in the cooling portion 114, the coolant flow path direction may be a direction linking the coolant inlet 97 and the coolant outlet 98.

Figure 20:
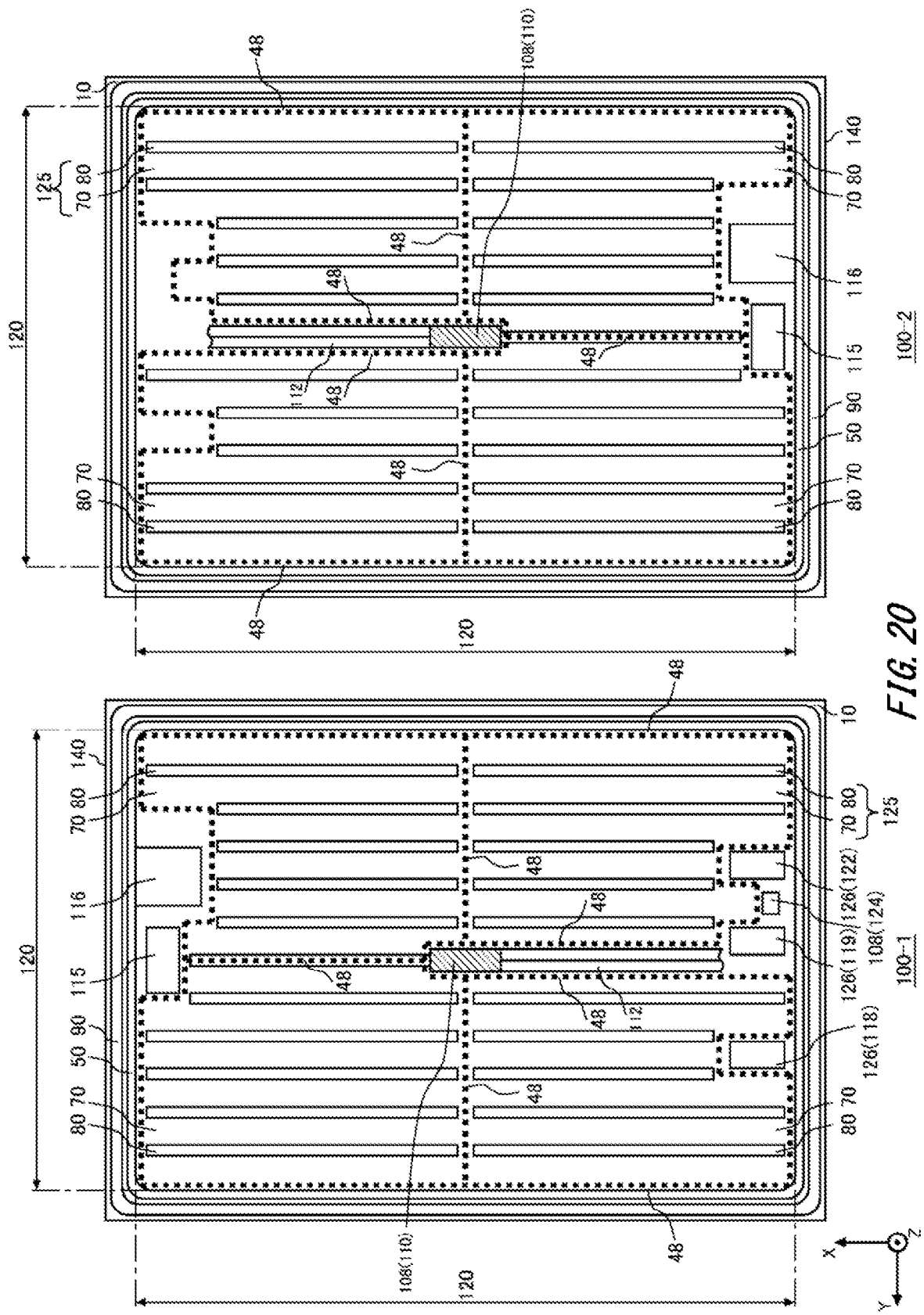
FIG. 20 is a figure showing another exemplary structure of the top surface of the semiconductor device 100 according to one embodiment of the present invention.

FIG. 20 is a figure showing another exemplary structure of the top surface of the semiconductor device 100 according to one embodiment of the present invention. The semiconductor modules 300, 400 have the semiconductor devices 100. In FIG. 20, exemplary top surfaces of the semiconductor device 100-1 and semiconductor device 100-2 are shown, respectively. The semiconductor device 100-1 is provided on one side (the coolant outlet 98 side) of the semiconductor modules 300, 400 in the coolant flow path direction. In addition, the semiconductor device 100-2 is provided on the other side (the coolant inlet 97 side) of the coolant flow path direction in the semiconductor modules 300, 400.

The semiconductor device 100-1 includes the active portion 120 and edge termination structure portion 90. In the active portion 120, a main semiconductor element portion 125 and a sense semiconductor element portion 124 are formed. The main semiconductor element portion 125 is provided with transistor portions 70 and diode portions 80. In the present example, the transistor portions 70 and diode portions 80 are provided to extend along the X-axis direction. In addition, in the present example, the transistor portions 70 and diode portions 80 are provided alternately in the Y-axis direction.

In the semiconductor device 100-1, the gate pad 116, dummy gate pad 115 and a plurality of detection pads 126 are provided above the top surface 21 of the semiconductor substrate 10. In one example, the detection pads 126 are the anode pad 119, the cathode pad 118 and the sense emitter pad 122. In the semiconductor device 100-1, the detection pads 126 are provided on one (on the X-axis negative side) of end sides facing in the X-axis direction, and the gate pad 116 and dummy gate pad 115 are provided on the other (on the X-axis positive side) of the end sides. Note that the number and types of pads provided in the semiconductor substrate 10 are not limited to those in the example shown in FIG. 20.

In the semiconductor device 100-1, the sense semiconductor element portion 124 is provided above the top surface 21 of the semiconductor substrate 10. In the present example, the sense semiconductor element portion 124 is provided on one (on the X-axis negative side) of end sides facing in the X-axis direction. The sense semiconductor element portion 124 is connected to the sense emitter pad 122, and the sense emitter pad 122 is connected to the sense emitter terminal (SE).

The cathode pad 118 and anode pad 119 are connected to the anode and cathode of the temperature sense diode of the temperature detecting portion 110, respectively. The gate pad 116 is connected with gate metal layers of the transistor portions 70. The dummy gate pad 115 is a pad to be used for screening of dummy trenches.

The semiconductor device 100-1 includes a gate runner 50 that supplies gate voltage to the transistor portions 70. In one example, the gate runner 50 is provided above the top surface 21 of the semiconductor substrate 10, and is insulated from the top surface 21 by the interlayer dielectric film 38.

The gate runner 50 is provided to pass through between an end side of the semiconductor substrate 10 and each pad when seen from above. The gate runner 50 in the present example is provided to pass through between each of the gate pad 116, cathode pad 118, anode pad 119 and sense emitter pad 122 and the end side closest to these pads and to be parallel to the end side. The gate runner 50 is connected with the gate pad 116. In addition, the gate runner 50 is provided to surround the active portion 120 between the other end sides of the semiconductor substrate 10 and the active portion 120. That is, the gate runner 50 in the present example is provided to form a ring along individual end sides of the semiconductor substrate 10.

The gate runners 48 bypass individual pads on an X-Y plane and are connected with the gate runner 50. The gate runners 48 may be provided above the active portion 120. The gate runners 48 may be provided to be parallel in the X-axis direction along the temperature detecting portion 110 and temperature detecting line 112.

The edge termination structure portion 90 is provided at the top surface of the semiconductor substrate 10 and between the gate runner 50 and the outer periphery 140 of the semiconductor substrate 10. The edge termination structure portion 90 may be arranged to form a ring so as to surround the gate runner 50 at the top surface of the semiconductor substrate 10. The edge termination structure portion 90 in the present example is arranged along the outer periphery 140 of the semiconductor substrate 10.

The semiconductor device 100-1 includes a detecting portion 108. In one example, the detecting portion 108 is the temperature detecting portion 110 or sense semiconductor element portion 124. The semiconductor device 100-1 has a detection pad 126 connected to the detecting portion 108. On the other hand, the semiconductor device 100-2 includes a detecting portion 108, but not a detection pad 126.

The temperature detecting portion 110 is provided above the active portion 120. The temperature detecting portion 110 may be provided at the middle of the active portion 120 when the semiconductor substrate 10 is seen from above. The temperature detecting portion 110 has a longitudinal side extending in a predetermined longitudinal direction. Although the longitudinal direction in the present example is the X-axis direction, the longitudinal direction may be different from the X-axis direction. The temperature detecting portion 110 may extend across one or more transistor portions 70 and one or more diode portions 80.

The temperature detecting line 112 is provided above the active portion 120. The temperature detecting line 112 is connected with the temperature detecting portion 110. On the top surface 21 of the semiconductor substrate 10, the temperature detecting line 112 extends to an end portion of the active portion 120 and is connected with the cathode pad 118 and anode pad 119. The temperature of the temperature detecting portion 110 can be detected by measuring electrical characteristics of the temperature detecting portion 110 via the cathode pad 118 and anode pad 119.

The temperature detecting line 112 in the present example is formed of aluminum (Al). The temperature detecting line 112 may be formed by sputtering aluminum (Al). That is, a line connecting the temperature detecting line 112 and the cathode pad 118 and a line connecting the temperature detecting line 112 and the anode pad 119 may be formed by etching aluminum (Al) after aluminum (Al) is sputtered. Note that the temperature detecting line 112 may be formed of polysilicon.

The semiconductor device 100-2 has a configuration obtained by reversing the semiconductor device 100-1 in the X-axis direction. The areas of the active portions 120 of the semiconductor device 100-1 and the semiconductor device 100-2 are the same. Because of this, during operation of the semiconductor device 100-1 and semiconductor device 100-2, substantially the same current flows in the semiconductor device 100-1 and the semiconductor device 100-2.

In the semiconductor device 100-1, the cathode pad 118, anode pad 119 and sense emitter pad 122, and the sense semiconductor element portion 124 are arranged on one (on the X-axis negative side) of the end sides facing in the X-axis direction, and the gate pad 116 is arranged on the other (on the X-axis positive side) of the end sides. In the semiconductor device 100-2, detection pads 126 are not provided, and a gate pad 116 is arranged on one (on the X-axis negative side) of the end sides.

In the semiconductor device 100-2, the temperature detecting portion 110 and sense semiconductor element portion 124 as the detecting portion 108 may be built in. That is, the semiconductor devices 100-1, 100-2 may be the same chip. However, if in particular as the detection pad 126 in the semiconductor device 100-2, the sense emitter pad 122 connected to the sense semiconductor element portion 124 is provided, and the sense emitter pad 122 is released, there is a fear that the gate potential of the sense semiconductor element portion 124 might become instable, and operation of the element might be impaired. Although such a drawback can be solved by connecting the sense emitter pad 122 as the detection pad 126 to the emitter potential, additional lines become necessary, and this might run counter to miniaturization of products. Because of this, in the present example, signals from the temperature detecting portion 110 and sense semiconductor element portion 124 that are built in may be invalidated such that they cannot be taken out. Specifically, for example, when depositing the emitter electrode 52 onto the semiconductor substrate 10 without providing the detection pad 126, these detecting portions 108 may be covered. In addition, a protective film formed of polyimide or the like may cover, from above, the detecting portions 108 covered with the emitter electrode 52, or a protective film formed of polyimide or the like may cover, from above, the detecting portions 108 not being covered with the emitter electrode 52.

In the semiconductor modules 300, 400, the semiconductor device 100-3 has the same configuration as that of the semiconductor device 100-1 in the present example. In addition, the semiconductor device 100-4 has the same configuration as that of the semiconductor device 100-2 in the present example.

Figure 21:
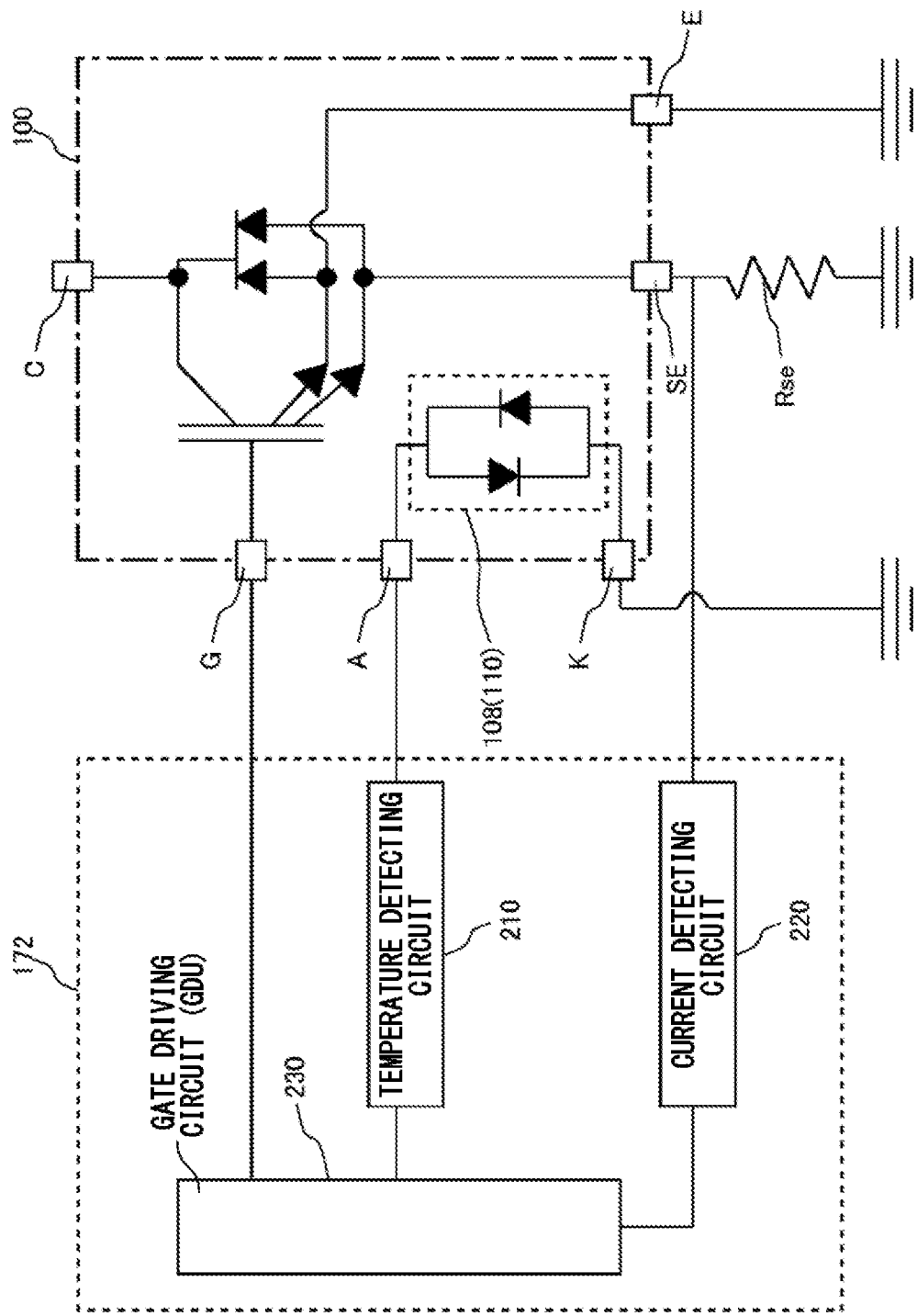
FIG. 21 is a schematic circuit diagram of a semiconductor circuit device 500 according to one embodiment of the present invention.

FIG. 21 is a schematic circuit diagram of a semiconductor circuit device 500 according to one embodiment of the present invention. As shown in FIG. 21, the semiconductor circuit device 500 in the present example includes the semiconductor device 100. The semiconductor device 100 has the main semiconductor element portion 125 and sense semiconductor element portion 124 (please see FIG. 22 and FIG. 23) provided in the semiconductor substrate 10. The main semiconductor element portion 125 includes transistor portions 70 and diode portions 80. The sense semiconductor element portion 124 includes another transistor portion 71 different from the transistor portions 70, and another diode portion 81 that is arranged on the inner side relative to the transistor portion 71 and is different from the diode portions 80.

In addition, the semiconductor circuit device 500 includes a control circuit 172 including: a current detecting circuit 220 that detects forward current and reverse current of the sense semiconductor element portion 124; a temperature detecting circuit 210 that detects temperature of the semiconductor device 100; and a gate driving circuit 230 that outputs a signal depending on the value of current of the reverse current. Here, the above-mentioned explanations apply to the semiconductor device 100 and control circuit 172 in the present example, respectively.

In the semiconductor device 100, the gate terminal (G) is equivalent to the gate pad 116. The anode terminal (A) is equivalent to the anode pad 119, and is connected with the temperature detecting circuit 210 provided outside the semiconductor device 100. The cathode terminal (K) is equivalent to the cathode pad 118, and is grounded outside the semiconductor device 100. The sense emitter terminal (SE) is equivalent to the sense emitter pad 122, and the current detecting circuit 220 and sense resistance Rse provided outside the semiconductor device 100 are connected downstream of the sense emitter pad 122 in parallel. The temperature detecting circuit 210 detects temperature based on voltage changes of the temperature sense diode of the temperature detecting portion 110. For example, the temperature sense diode has negative temperature characteristics that the resistance lowers as the temperature increases. The current detecting circuit 220 converts voltage drop of the sense resistance Rse into current, and detects a current flowing into the main semiconductor element portion 125 according to the area ratio between the main semiconductor element portion 125 and the sense semiconductor element portion 124. The gate driving circuit 230 drives the gate of the semiconductor device 100. The gate driving circuit 230 may receive a signal indicating abnormal heat-generation from the temperature detecting circuit 210, or a signal indicating overcurrent from the current detecting circuit 220 and perform protective operation to shut down the gate and so on.

Figure 22:
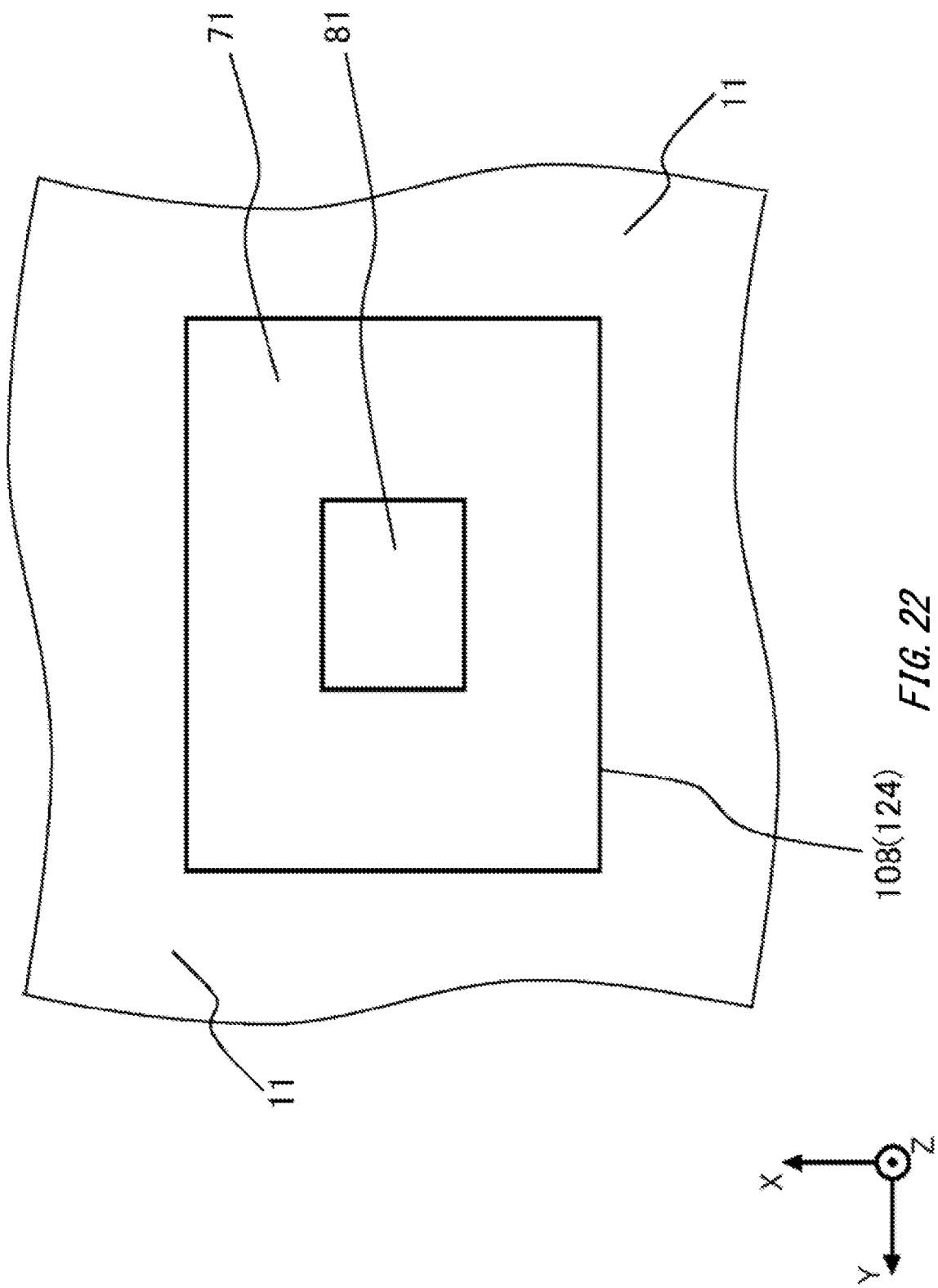
FIG. 22 is an enlarged view of a section including and around a sense semiconductor element portion 124 in FIG. 20.

FIG. 22 is an enlarged view of a section including and around the sense semiconductor element portion 124 in FIG. 20. As shown also in FIG. 21, one feature in the present example is that the sense semiconductor element portion 124 is constituted by a so-called reverse conducting-IGBT having the transistor portion 71 and diode portion 81. The sense semiconductor element portion 124 has an impurity concentration higher than that of the base regions 14 in a top view, and is surrounded by the second-conductivity-type (P type) well region 11 deeper than trench portions. Here, in the present example, the diode portion 81 is arranged on the inner side relative to the transistor portion 71 by the diode portion 81 being surrounded by the transistor portion 71.

The diode portion 81 may be a region that appears imaginarily on the top surface 21 if a region in which the cathode region 82 is provided at the bottom surface 23 is imaginarily projected onto the top surface 21. Since, in the present example, the diode portion 81 is surrounded by the transistor portion 71, inflow of carriers from the well region 11 into the cathode region 82 of the diode portion 81 can be prevented. Note that the area ratio between the transistor portion 71 and the diode portion 81 in the sense semiconductor element portion 124 may be equal to the area ratio between the transistor portions 70 and the diode portions 80 in the semiconductor device 100 shown in FIG. 20.

Figure 23:
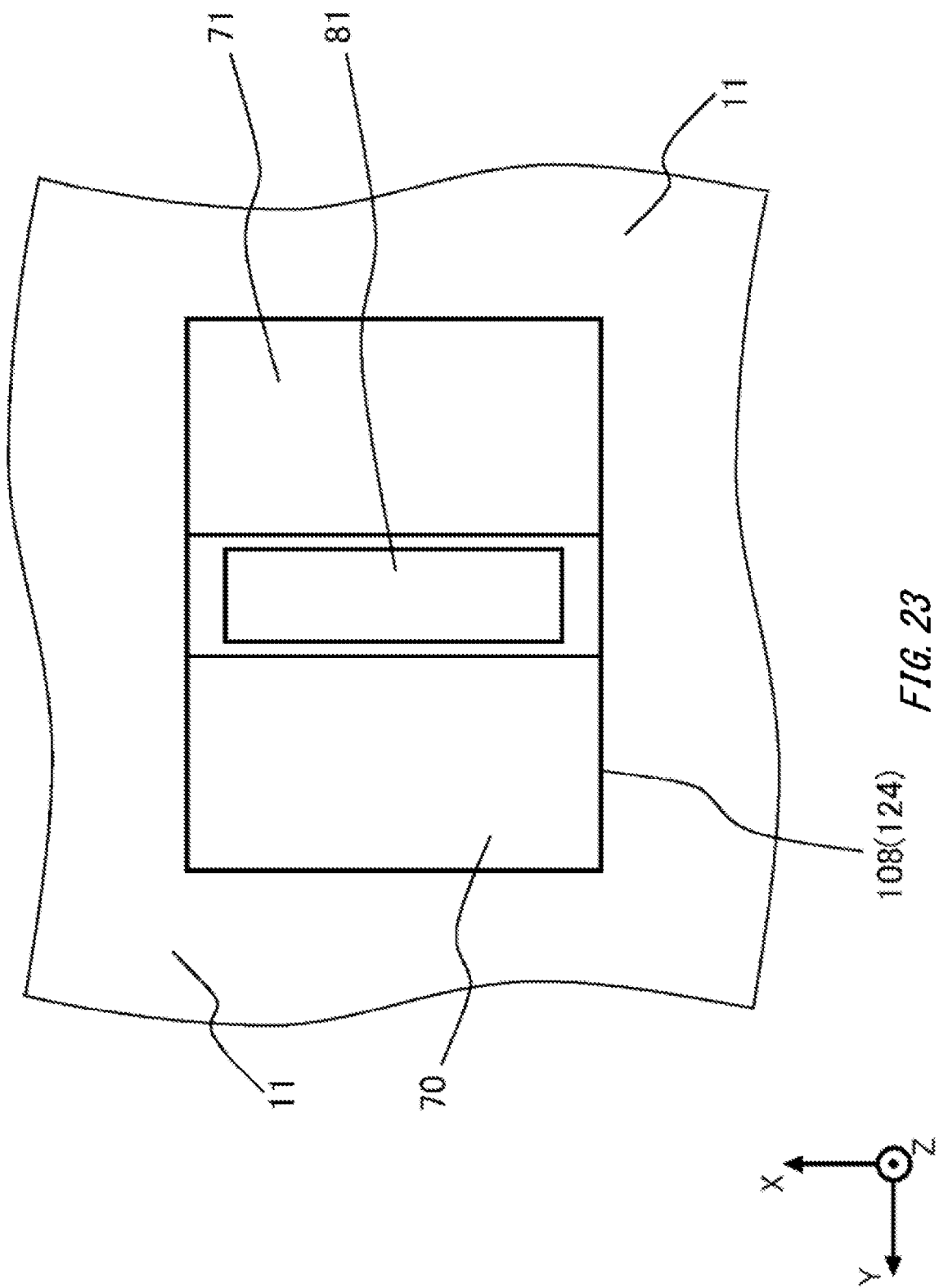
FIG. 23 is another enlarged view of a section including and around the sense semiconductor element portion 124 in FIG. 20.

FIG. 23 is another enlarged view of a section including and around the sense semiconductor element portion 124 in FIG. 20. The present example is different from the sense semiconductor element portion 124 shown in FIG. 22 in that a diode portion 81 is sandwiched by two transistor portions 71. The diode portion 81 may be a region that appears imaginarily on the top surface 21 if a region in which the cathode region 82 is provided at the bottom surface 23 is imaginarily projected onto the top surface 21.

A region that is in the sense semiconductor element portion 124 but not the transistor portion 71 and diode portion 81 in a top view may be provided with the collector region 22 at the bottom surface 23. Since, in the present example, the cathode region 82 is separated from the well region 11 and the diode portion 81 is arranged on the inner side relative to the transistor portion 71, inflow of carriers from the well region 11 into the cathode region 82 of the diode portion 81 can be prevented. Note that the area ratio between the transistor portion 71 and the diode portion 81 in the sense semiconductor element portion 124 may be equal to the area ratio between the transistor portions 70 and the diode portions 80 in the semiconductor device 100 shown in FIG. 20.

Figure 24:
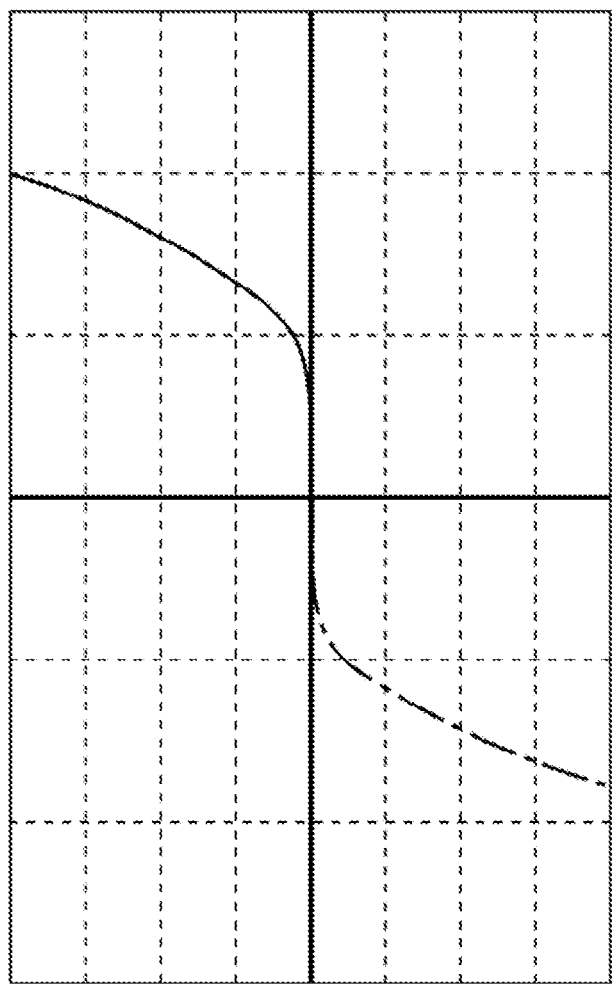
FIG. 24 is a figure showing a relationship between voltage Vce and current Ic of the semiconductor device 100 shown in FIG. 21.

FIG. 24 is a figure showing a relationship between voltage Vce and current Ic of the semiconductor device 100 shown in FIG. 21. As shown in FIG. 24, since the transistor portions 70, 71 start operation if the voltage Vce is increased from zero in the positive direction, the current Ic increases in the positive direction along with increase of the voltage Vce. Since the diode portions 80, 81 start operation if the voltage Vce is increased from zero in the negative direction, the current Ic increases in the negative direction along with increase of the voltage Vce.

Figure 25:
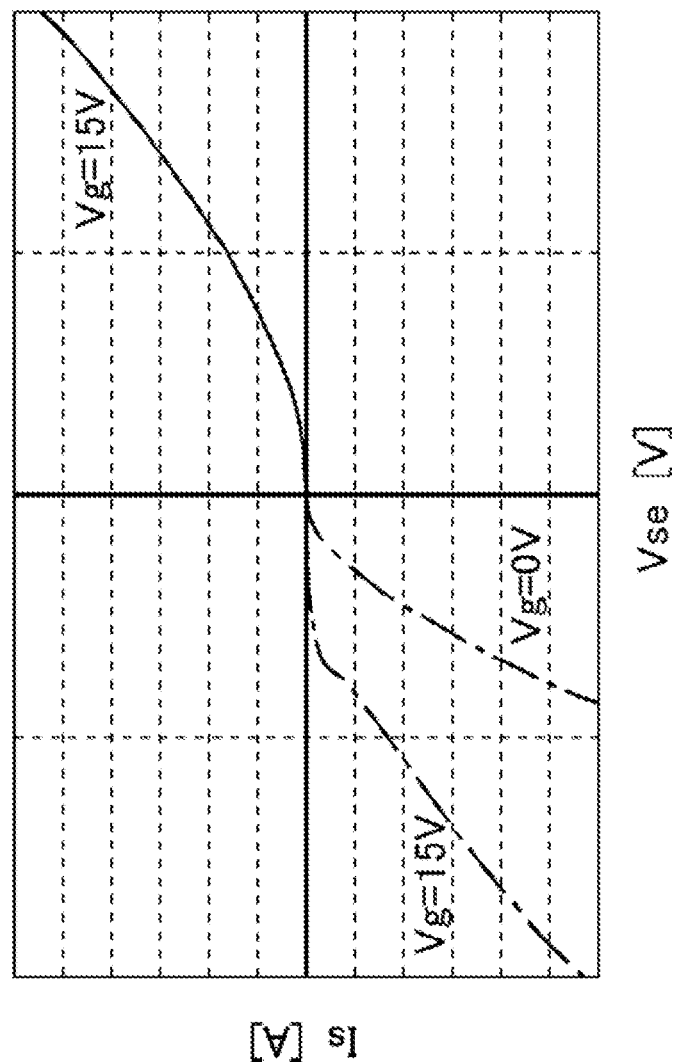
FIG. 25 is a figure showing current sensing characteristics of the semiconductor device 100 shown in FIG. 21.

FIG. 25 is a figure showing current sensing characteristics of the semiconductor device 100 shown in FIG. 21. In one example, in FIG. 25, operation in the case where the gate voltage Vg which is 15 (V) is applied, and the case where the gate voltage Vg is not applied (Vg=0 (V)) is shown. As shown in FIG. 25, in the semiconductor device 100 in the present example, the sense current Is increases in the positive direction along with increase of the sense voltage Vse in the positive direction. In addition, in the semiconductor device 100 in the present example, since the sense semiconductor element portion 124 is constituted by a reverse conducting-IGBT, the current Is increases in the negative direction along with increase of the voltage Vse in the negative direction. In addition, also if the voltage Vg is zero, the current Is increases in the negative direction along with increase of the voltage Vse in the negative direction. If the voltage Vg is zero, increase of the current Ic in the negative direction along with increase of the voltage Vse in the negative direction becomes steeper than in the case where the voltage Vg is 15 V. Note that the present example is not the sole example, and the sense semiconductor element portion 124 may be constituted only by a transistor portion 71, without a diode portion 81.

Figure 26:
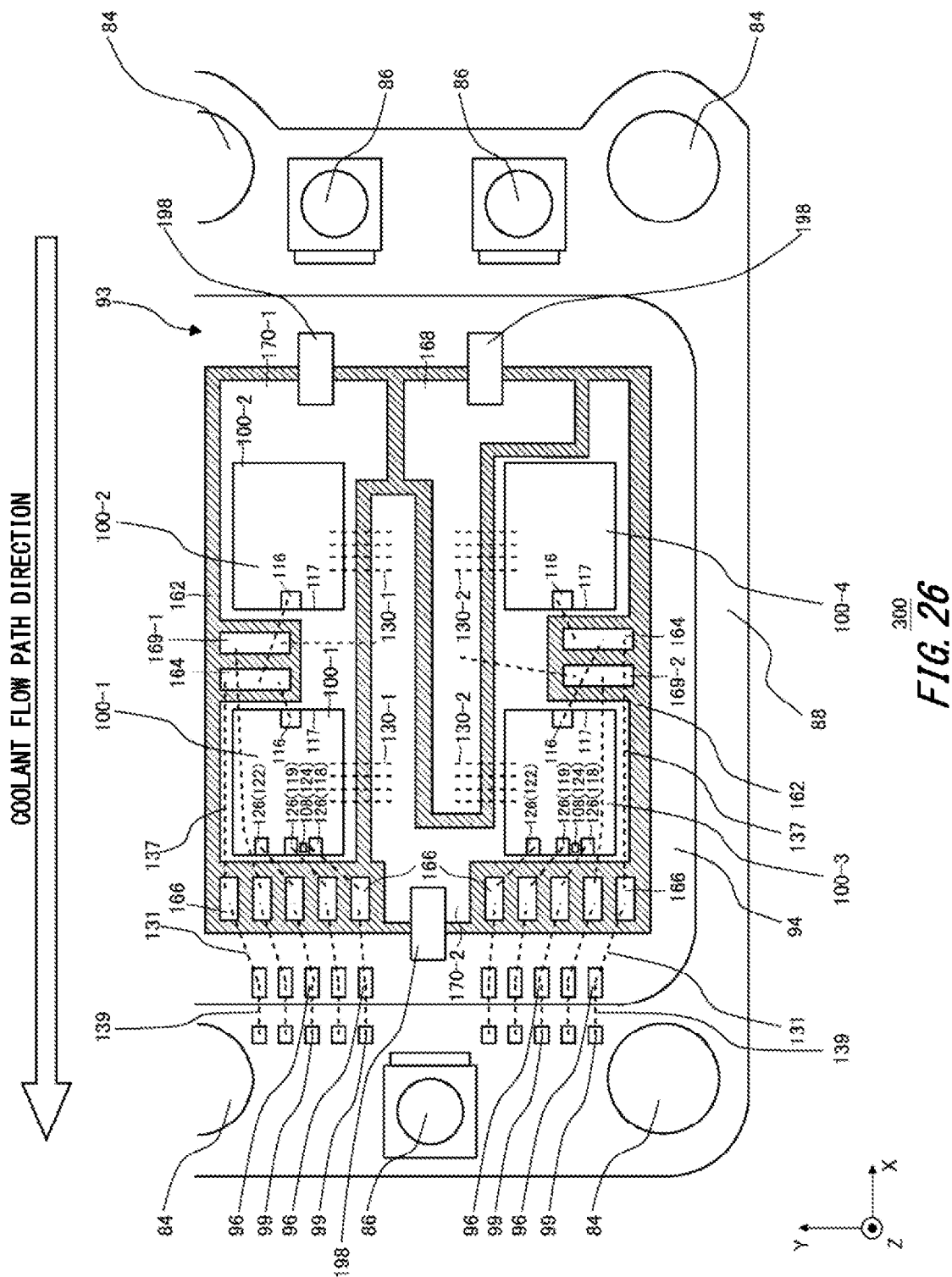
FIG. 26 is a figure showing a section including and around the last circuit board 162 in the −Y-axis direction of the semiconductor module 300 shown in FIG. 16.

FIG. 26 is a figure showing a section including and around the last circuit board 162 in the −Y-axis direction of the semiconductor module 300 shown in FIG. 16. In FIG. 26, the flow path direction of a coolant flowing in the cooling portion 114 is shown as well.

The areas of the active portions 120 of the semiconductor device 100-1 and the semiconductor device 100-2 arranged in the line pattern 170-1 are the same. Because of this, during operation of the semiconductor device 100-1 and semiconductor device 100-2, substantially the same current flows in the semiconductor device 100-1 and the semiconductor device 100-2, and the degrees of heat-generation of the semiconductor device 100-1 and the semiconductor device 100-2 are substantially the same. In order to keep the heat-generation at or lower than tolerated temperature, cooling is performed by causing a coolant to flow from the coolant inlet 97 of the cooling portion 114 to its coolant outlet 98. Here, since, as mentioned above, the coolant is caused to flow from the coolant inlet 97 to the coolant outlet 98, it is warmed by heat-generation of the semiconductor devices 100-2, 100-4 arranged on the other side (on the X-axis positive side) of a predetermined flow path direction, and the semiconductor devices 100-1, 100-3 arranged on one side (on the X-axis negative side) of the predetermined flow path direction are cooled by the coolant that has been warmed as compared to that when flowing through the coolant inlet 97. Here, the other side is the upstream side, and the one side is the downstream side. Accordingly, only the detecting portions 108 of the semiconductor devices 100 arranged downstream need to be monitored in order to use the semiconductor devices 100 mounted on the semiconductor modules 300, 400 under tolerated conditions (at tolerated temperature or lower, or with tolerated current or lower). Hereinafter, this is explained in detail using FIG. 27.

Figure 27:
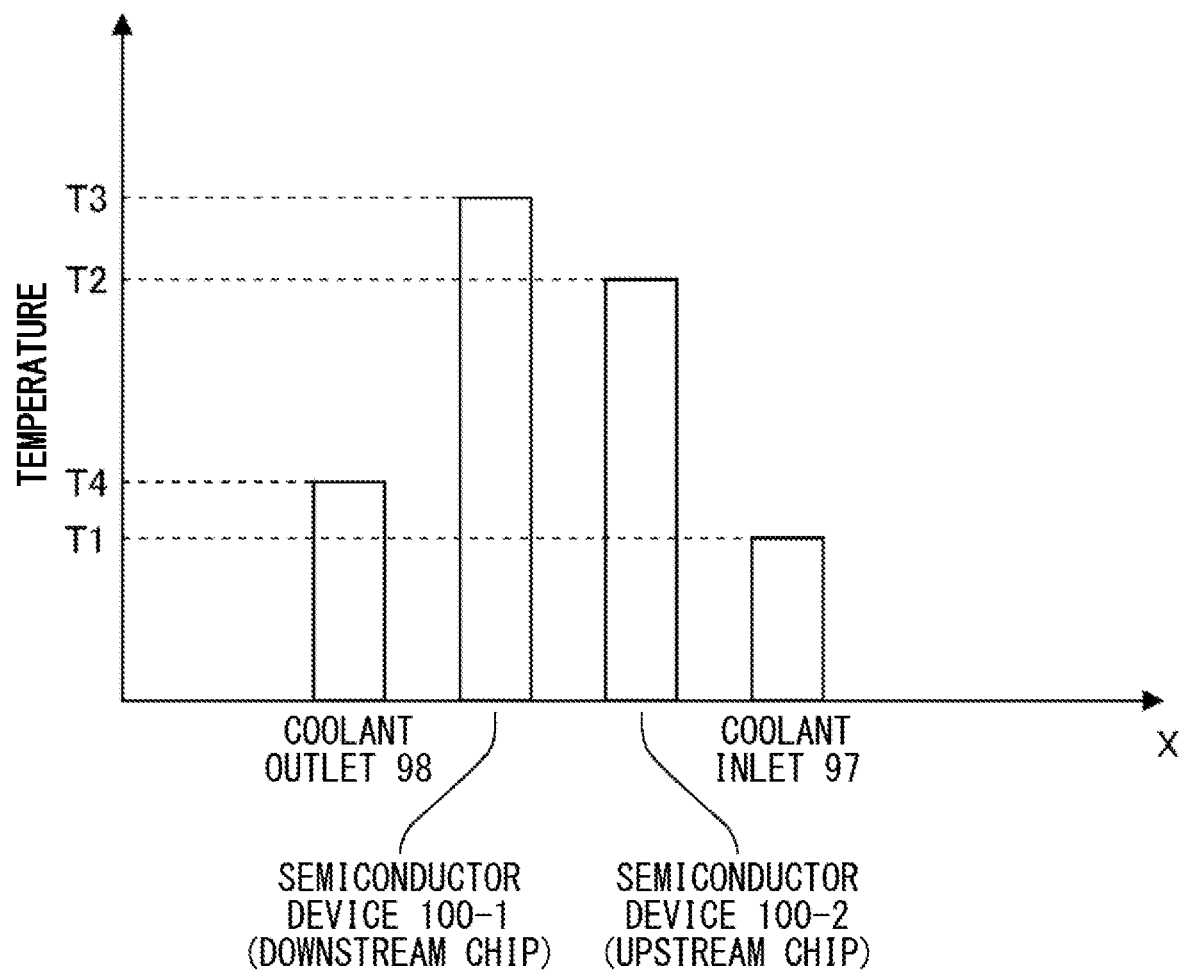
FIG. 27 is a figure showing temperature of a coolant in the semiconductor module 300 shown in FIG. 26 for each position in the X-axis direction.

FIG. 27 is a figure showing temperature of a coolant in the semiconductor module 300 shown in FIG. 26 for each position in the X-axis direction. As shown in FIG. 27, the temperature of coolant at the coolant inlet 97 is referred to as a temperature T1. The temperature of coolant at the semiconductor device 100-2 arranged on the upstream side of the coolant is referred to as a temperature T2. The temperature of coolant at the semiconductor device 100-1 arranged downstream of the coolant is referred to as a temperature T3. The temperature of coolant at the coolant outlet 98 is referred to as a temperature T4.

Since the coolant let in from the coolant inlet 97 (please see FIG. 17) cools the semiconductor device 100-2 and semiconductor device 100-4, the temperature of it increases due to the cooling. Because of this, the temperature T2 is higher than the temperature T1. Since the coolant having cooled the semiconductor device 100-2 and semiconductor device 100-4 cools next the semiconductor device 100-1 and semiconductor device 100-3, the temperature increases further due to this cooling. Because of this, the temperature T3 is higher than the temperature T2. The temperature of the coolant having cooled the semiconductor device 100-1 and semiconductor device 100-3 does not increase since there are no semiconductor devices 100 at the coolant outlet 98. Because of this, the temperature T4 is lower than the temperature T3. Because of this, by monitoring the temperature T3 of the semiconductor device 100-1 and semiconductor device 100-3, it can be judged whether or not the individual semiconductor devices 100 are in an overheated state. The temperature T2 of the semiconductor device 100-2 and semiconductor device 100-4 needs not be monitored.

In the example of FIG. 26, since the semiconductor device 100-1 and the semiconductor device 100-3 arranged on one side (the X-axis negative side) of the coolant flow path direction are monitored to judge whether or not they are in an overheated state, the detection pads 126 (the anode pad 119, cathode pad 118 and sense emitter pad 122) are connected to the line patterns 166. The line patterns 166 are connected with the relay terminals 96 provided to the housing 88 of the semiconductor module 300, and the relay terminals 96 are connected with the control terminals 99. Thereby, the overheated state of the semiconductor devices 100 can be monitored from the outside of the semiconductor module 300.

Since the semiconductor device 100-2 and semiconductor device 100-4 arranged on the other side (the X-axis positive side) of the coolant flow path direction are not monitored to judge whether or not they are in an overheated state, the detecting portions 108 of the semiconductor device 100-2 and semiconductor device 100-4 may be deactivated. Specifically, detection pads 126 needs not be provided. In addition, since detection pads 126 are not provided in the semiconductor device 100-2 and semiconductor device 100-4, line patterns 166, relay terminals 96 and control terminals 99 need not be provided.

In the present example, the external lines 130-1 connect the semiconductor devices 100-1, 100-2 with the line pattern 170-2. The line pattern 170-2 is connected with the line pattern 169-1 arranged between the semiconductor device 100-1 and the semiconductor device 100-2, and the line pattern 169-1 is connected with one line pattern 166. The one line pattern 166 is connected with one relay terminal 96. In addition, the external lines 130-2 connect the semiconductor device 100-3 and semiconductor device 100-4 with the line pattern 168. The line pattern 168 is connected with the line pattern 169-2 arranged between the semiconductor device 100-3 and the semiconductor device 100-4, and the line pattern 169-2 is connected with one other line pattern 166. The one other line pattern 166 is connected with one other relay terminal 96. Since, in the present example, line patterns 169 are arranged between two semiconductor devices 100, and serve the role as relay terminals, line patterns 166 can be arranged on the other side (the X-axis positive side) of the coolant flow path direction.

Since the semiconductor module 300 in the present example does not have detection pads 126 of the semiconductor device 100-2 and semiconductor device 100-4, line patterns 166, relay terminals 96, and control terminals 99 corresponding to them also are not provided. Because of this, the number of control terminals 99 to be taken out of the semiconductor module 300 can be reduced, and miniaturization becomes possible.

Although in the semiconductor module 300 in the present example, both the temperature detecting portion 110 and the sense semiconductor element portion 124 are provided downstream of semiconductor devices 100 which are arranged upstream and downstream of a coolant and constitute one arm, only one of them may be arranged.

Although, in the present example, two semiconductor devices 100 are arranged by being connected in parallel in one arm, three semiconductor devices 100 or more may be arranged by being connected in parallel. The larger the number of semiconductor devices 100 arranged in one arm is, the more significant the effect of miniaturization attained by arranging control terminals 99 on one side in the coolant flow path direction, and not arranging on the other side is. Note that the predetermined flow path direction may be one having a upstream side on the side where detecting portions 108 are deactivated in advance and a downstream side on the side from which signals are taken out of detecting portions 108.

As shown in FIG. 26, the line patterns 164 as the gate terminals of the semiconductor module 300 may be arranged between the semiconductor device 100-1 and the semiconductor device 100-2 in the coolant flow path direction. The gate pad 116 of the semiconductor device 100-1 and the gate pad 116 of the semiconductor device 100-2 may be connected to the line patterns 164 as the gate terminals, respectively. By the line patterns 164 as the gate terminals being arranged between the semiconductor device 100-1 and the semiconductor device 100-2 in the coolant flow path direction, the gate terminals can be shared by the semiconductor device 100-1 and semiconductor device 100-2. Thereby, the number of gate terminals of the semiconductor module 300 can be reduced, and miniaturization becomes possible.

A line pattern 164 as a gate terminal is connected with one line pattern 166 through a line 137. In addition, the one line pattern 166 is connected with one relay terminal 96 provided to the housing 88. The relay terminal 96 is connected with a control terminal 99 through a line 139. That is, a gate voltage is applied to two semiconductor devices 100 through control terminals 99, lines 139, one relay terminal 96, lines 131, one line pattern 166, lines 137 and gate terminals 164.

The lines 131, lines 137 and lines 139 may be metal lines formed of aluminum, copper, gold or the like. The lines 137 may be thicker than the lines 131 and lines 139. Since the lines 137 are longer than the lines 131 and lines 139, the amount of heat generated by the lines 137 due to current increases more easily than those of the lines 131 and lines 139, and the lines 137 get disconnected more easily. Because of this, by making the lines 137 thicker than the line 131 and lines 139, disconnection of the lines 137 can be suppressed.

As shown in FIG. 26, in the semiconductor device 100-1 and semiconductor device 100-2, the gate pad 116 of one of the semiconductor devices, the semiconductor device 100-2, and the gate pad 116 of the other of the semiconductor devices, the semiconductor device 100-1, may be arranged to face each other in the coolant flow path direction. That is, in the coolant flow path direction, line patterns 164 as gate terminals may be arranged between the gate pad end side 117 of the semiconductor device 100-1 and the gate pad end side 117 of the semiconductor device 100-2. By arranging the two semiconductor devices 100 in this manner, lines between the gate pads 116 and the line patterns 164 as the gate terminals of the two semiconductor devices 100 can be made short. In addition, since a gate terminal is shared between two semiconductor devices 100, the semiconductor module 300 can be miniaturized.

Note that although, in the configuration in the above-mentioned embodiment, the lines 131 connecting to the control terminals 99 are pulled out upward and downward (the X-axis direction), this is not the sole example, and another arrangement may be adopted. For example, the lines 131 may be pulled out leftward and rightward (the Y-axis direction) from the semiconductor devices 100. In addition, in one configuration, the control terminals 99 may not be arrayed in one line in the Y-axis direction.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device provided with a semiconductor substrate, the semiconductor device comprising:
   one or more transistor portions provided in the semiconductor substrate;
   one or more diode portions provided in the semiconductor substrate, and arranged to alternate with the one or more transistor portions in an array direction parallel to a top surface of the semiconductor substrate;
   a temperature detecting portion provided above the top surface of the semiconductor substrate and having a longitudinal side in a predetermined longitudinal direction;
   a top surface electrode provided above the top surface of the semiconductor substrate; and
   one or more external lines that have a connecting part connected with the top surface electrode and electrically connect the top surface electrode to a circuit outside the semiconductor device, wherein
   the one or more external lines and corresponding connecting parts are arranged not to overlap the temperature detecting portion,
   a density of the connecting parts increases within a given distance range from the temperature detecting portion, the given distance range being equal to 500% or shorter of a pitch of the one or more diode portions,
   the temperature detecting portion extends across the one or more transistor portions and the one or more diode portions in the longitudinal direction, and
   the connecting part of at least one of the one or more external lines is arranged around the temperature detecting portion when seen from above.

2. The semiconductor device according to claim 1, wherein the connecting part of the at least one of the one or more external lines is arranged above the one or more transistor portions and the one or more diode portions.

3. The semiconductor device according to claim 1, wherein a length of the temperature detecting portion in the longitudinal direction is referred to as a detecting-portion length, a distance between the connecting part of the at least one of the one or more external lines and the temperature detecting portion when seen from above is equal to or shorter than the detecting-portion length.

4. The semiconductor device according to claim 1, wherein
   the external lines are wires, and
   if a longitudinal length of the connecting parts of the external lines when seen from above is referred to as a connecting-portion length, a distance between the connecting part of the at least one of the external lines and the temperature detecting portion when seen from above is equal to or shorter than the connecting-portion length.

5. The semiconductor device according to claim 1, wherein
the one or more external lines are wires, and comprise a plurality of external lines connected to the top surface electrode,
the connecting parts of the external lines are provided at predetermined line intervals in a direction perpendicular to the longitudinal direction, and
a distance between the connecting part of the at least one of the external lines and the temperature detecting portion when seen from above is equal to or shorter than the line interval.

6. The semiconductor device according to claim 1, wherein
the one or more external lines are wires, and
when seen from above, the connecting part of at least one of the one or more external lines is provided to face the temperature detecting portion in a direction perpendicular to the longitudinal direction.

7. The semiconductor device according to claim 6, wherein
two of the connecting parts are arranged around the temperature detecting portion when seen from above and arranged along a direction parallel to the longitudinal direction of the temperature detecting portion, and
each of the two of the connecting parts is arranged to face a part, in the longitudinal direction, of the temperature detecting portion.

8. The semiconductor device according to claim 6, wherein
at least one additional connecting part is arranged around the temperature detecting portion when seen from above, and
when seen from above, the temperature detecting portion is arranged inside a rectangular region circumscribing the at least one additional connecting part and the two of the connecting parts.

9. The semiconductor device according to claim 1, wherein
the one or more external lines are wires and comprise a plurality of external lines, and
a plurality of the connecting parts of the plurality of external lines are arranged around the temperature detecting portion more than in a region not around the temperature detecting portion when seen from above.

10. The semiconductor device according to claim 1, further comprising:
a gate pad provided above the top surface of the semiconductor substrate and connected with a gate metal layer of the one or more transistor portions; and
a temperature detecting line provided above the top surface of the semiconductor substrate and connected with the temperature detecting portion, wherein
the gate pad is arranged opposite to the temperature detecting line when seen from above with respect to the temperature detecting portion.

11. The semiconductor device according to claim 10, further comprising a cathode pad and an anode pad that are provided above the top surface of the semiconductor substrate and are connected with the temperature detecting line, wherein
the cathode pad and the anode pad are arranged opposite to the gate pad with respect to the temperature detecting portion.

12. A semiconductor package comprising:
the semiconductor device according to claim 1; and
an external circuit.

13. The semiconductor package according to claim 12, comprising two of the semiconductor devices, each of which is the semiconductor device according to claim 1,
each of the semiconductor devise having:
a gate pad provided above the top surface of the semiconductor substrate and connected with a gate metal layer of the one or more transistor portions;
a temperature detecting line provided above the top surface of the semiconductor substrate and connected with the temperature detecting portion; and
a cathode pad and an anode pad that are provided above the top surface of the semiconductor substrate and are connected with the temperature detecting line, wherein
the gate pad is arranged opposite to the temperature detecting line when seen from above with respect to the temperature detecting portion,
the cathode pad and the anode pad are arranged opposite to the gate pad with respect to the temperature detecting portion, and
in each of the two of the semiconductor devices, an end side that is among individual end sides of the semiconductor substrate and is closest to the gate pad when seen from above is referred to as a gate pad end side, and the two of the semiconductor devices are arranged such that the gate pad end side of each of the two of the semiconductor devices face each other.

* * * * *